United States Patent
Chung et al.

(10) Patent No.: US 11,317,514 B2
(45) Date of Patent: Apr. 26, 2022

(54) METHOD FOR FORMING CIRCUITS USING SEED LAYER AND ETCHANT COMPOSITION FOR SELECTIVE ETCHING OF SEED LAYER

(71) Applicant: InkTec Co., Ltd., Ansan-si (KR)

(72) Inventors: Kwang-Choon Chung, Yongin-si (KR); Byung Woong Moon, Siheung-si (KR); Su Han Kim, Ansan-si (KR); Jung Yoon Moon, Ansan-si (KR); Hyeon-Jun Seong, Ansan-si (KR); Jae Rin Kim, Yongin-si (KR)

(73) Assignee: InkTec Co., Ltd., Ansan-si (KR)

( * ) Notice: Subject to any disclaimer, the term of this patent is extended or adjusted under 35 U.S.C. 154(b) by 182 days.

(21) Appl. No.: 16/484,479

(22) PCT Filed: Feb. 9, 2018

(86) PCT No.: PCT/KR2018/001754
§ 371 (c)(1),
(2) Date: Jan. 23, 2020

(87) PCT Pub. No.: WO2018/147678
PCT Pub. Date: Aug. 16, 2018

(65) Prior Publication Data
US 2020/0221578 A1   Jul. 9, 2020

(30) Foreign Application Priority Data

Feb. 9, 2017  (KR) .................. 10-2017-0018275
Feb. 14, 2017 (KR) .................. 10-2017-0020202
Feb. 17, 2017 (KR) .................. 10-2017-0021847

(51) Int. Cl.
H05K 3/06   (2006.01)
C09K 13/00  (2006.01)
(Continued)

(52) U.S. Cl.
CPC ............. H05K 3/067 (2013.01); C09K 13/00 (2013.01); H05K 1/09 (2013.01); H05K 1/115 (2013.01);
(Continued)

(58) Field of Classification Search
CPC .......... C09K 13/00; H05K 1/09; H05K 1/115; H05K 3/067; H05K 3/188; H05K 3/285; H05K 3/424; H05K 3/425
See application file for complete search history.

(56) References Cited

U.S. PATENT DOCUMENTS 7,060,618 B2 *  6/2006  Inoue .................. C23C 18/1608
                                              257/E21.174
2018/0199443 A1  7/2018  Okumura et al.

FOREIGN PATENT DOCUMENTS

JP   2004311912 A   * 11/2004
KR   10-0279323       2/2001
(Continued)

OTHER PUBLICATIONS

International Search Report and the Written Opinion dated Jun. 7, 2018 From the International Searching Authority Re. Application No. PCT/KR2018/001754. (14 Pages).
(Continued)

Primary Examiner — Carl J Arbes

(57) ABSTRACT

The present invention relates to a method for forming a circuit using a seed layer. The method for forming a circuit using a seed layer according to the present invention, may realize a fine pitch, increase the adhesion of the circuit, and prevent the migration phenomenon.

20 Claims, 23 Drawing Sheets

(51) Int. Cl.
    *H05K 1/09*     (2006.01)
    *H05K 1/11*     (2006.01)
    *H05K 3/18*     (2006.01)
    *H05K 3/28*     (2006.01)
    *H05K 3/42*     (2006.01)

(52) U.S. Cl.
    CPC ............ *H05K 3/188* (2013.01); *H05K 3/285* (2013.01); *H05K 3/424* (2013.01); *H05K 3/425* (2013.01); *H05K 2203/0723* (2013.01); *H05K 2203/0796* (2013.01)

(56) References Cited

FOREIGN PATENT DOCUMENTS

| KR | 10-0712879 | 4/2007 | |
|---|---|---|---|
| KR | 10-2009-0081566 | 7/2009 | |
| KR | 1020090081566 A | * | 7/2009 |
| KR | 101044790 B1 | * | 6/2011 |
| KR | 10-1044790 | | 9/2011 |
| KR | 10-2011-0088971 | | 12/2011 |
| KR | 101095380 B1 | * | 12/2011 |
| KR | 10-2013-0130515 | | 12/2013 |
| KR | 1020130130515 A | * | 12/2013 |
| KR | 10-2015-10121790 | | 10/2015 |
| KR | 10-1630435 | | 6/2016 |
| KR | 101630435 B1 | * | 6/2016 |
| WO | 2003035543 A1 | * | 5/2003 |
| WO | WO 2017/006652 | | 1/2017 |
| WO | WO 2018/147678 | | 8/2018 |

OTHER PUBLICATIONS

Office Action dated May 29, 2019 From the Korean Intellectual Property Office Re. Application No. 10-2018-0018264 (6 Pages).

* cited by examiner

METHOD FOR FORMING CIRCUITS USING SEED LAYER AND ETCHANT COMPOSITION FOR SELECTIVE ETCHING OF SEED LAYER

RELATED APPLICATIONS

This application is a National Phase of PCT Patent Application No. PCT/KR2018/001754 having International filing date of Feb. 9, 2018, which claims the benefit of priority of Korean Patent Applications Nos. 10-2017-0018275 filed on Feb. 9, 2017, 10-2017-0020202 filed on Feb. 14, 2017 and 10-2017-0021847 filed on Feb. 17, 2017. The contents of the above applications are all incorporated by reference as if fully set forth herein in their entirety.

FIELD AND BACKGROUND OF THE INVENTION

The present invention relates to a method of forming a circuit using a seed layer, and more particularly to a method of forming a circuit using a seed layer capable of securing adhesion, actualizing a fine line-width, and minimizing damage of the circuit during a process.

As a general method of forming a circuit, there has been mostly used a lithography process that employs a photosensitive film to perform exposure and etching. The lithography process refers to a method of first forming a plating layer with a conductive material on a base material, and then applying a photosensitive material onto the plating layer, thereby forming a pattern of the conductive material on the base material through the exposure and the etching. However, such a lithography process, by which a pitch is realizable up to about 35 μm, has a limit to forming a fine circuit pattern.

Further, to make a pitch more finely, a semi additive process (SAP) method has been developed. The SAP method forms a circuit pattern by forming a seed layer of a copper material on a polyimide (PI) film, forming a pattern using a photosensitive film, plating the inside of the pattern with copper or the like conductive material, removing the photosensitive film, and removing the seed layer exposed to a region other than the conductive pattern formed with the circuit.

However, the SAP method has a problem of poor adhesion because the seed layer is present between the film and the conductive pattern, and a problem of migration between wiring patterns when the seed layer exposed after removing the photosensitive film is not completely removed.

Meanwhile, both the seed layer and the circuit are generally made of copper (Cu), and the circuit is damaged when the seed layer is physically removed, thereby causing a defect. Further, it is difficult to use etching or the like chemical method to remove the seed layer and the conductive pattern because they are made of one material.

Further, to cope with film thinness of a printed circuit board, a coreless substrate, of which a total thickness is decreased by removing a core substrate and a signal processing time is shortened, has attracted attention.

In a case of the coreless substrate, the core substrate is not used, and therefore a carrier member is needed to perform a function of a supporter during a manufacturing process. A build-up layer, which includes a circuit layer and an insulation layer, is formed on each side of the carrier member by a typical circuit board manufacturing method, and then the carrier member is removed so that an upper circuit board and a lower circuit board can be separated, thereby completing the coreless substrate.

When the SAP method is applied to a manufacturing process for the coreless substrate, it is required to separate the build-up layer by removing the carrier member, and then remove the seed layer. When the seed layer is physically removed, the circuit is damaged, thereby causing a defect.

Further, when the seed layer is removed by etching and the like chemical method, an exposure surface of the circuit is damaged during an etching process for the seed layer because both the seed layer and the circuit are made of copper. In particular, such surface damage of the circuit causes a defective contact in a packaging process for electronic parts, and thus a yield of a manufacturing process is lowered.

In addition, a plasma process or a method of using an etching solution has been hitherto used as the most common method of etching a metal wiring or thin film. In the case of using the etching solution, the etching solution generally contains phosphoric acid, nitric acid, acetic acid, hydrochloric acid, sulfuric acid, ammonia, iron phosphate, iron nitrate, iron sulfate, iron hydrochloride, sodium chlorate, and water, and therefore etches not only silver but also other metals, metal alloy or a metal compound, thereby damaging a metal circuit layer. Thus, there has been a problem of forming a poor pattern of which an etch factor is low.

SUMMARY OF THE INVENTION

Accordingly, to solve such conventional problems, an aspect of the present invention is to provide a method of forming a circuit using a seed layer capable of achieving a fine circuit pitch, having good adhesion, and minimizing migration.

Further, an aspect of the present invention is to provide a method of forming a circuit using a seed layer, in which an etching solution capable of dissolving only the seed layer is used to selectively dissolve only the seed layer to thereby remove the seed layer.

Therefore, an aspect of the present invention is to provide a method of forming a circuit using a seed layer, in which only the seed layer is removed by a simple method, and a conductive pattern is prevented from damage, thereby decreasing a defect in a process.

Further, an aspect of the present invention is to provide a method of forming a circuit using a seed layer, in which a semi additive process (SAP) method is applied to a coreless substrate manufacturing process, thereby achieving high density and film-thinness of a circuit board and preventing the circuit from damage while removing the seed layer.

Further, an aspect of the present invention is to provide an etching solution composition, with which only silver, silver alloy or a silver compound is selectively etched minimizing removal of a metal circuit layer, thereby having a high etch factor and preventing a metal circuit layer from damage.

The foregoing aspects of the present invention are achieved by providing a method of forming a circuit using a seed layer, including: preparing a seed layer of a first conductive material; forming a pattern layer with a pattern groove, through which the seed layer is selectively exposed, on the seed layer; plating the pattern groove by filling a second conductive material into the pattern groove using a plating process; forming a resin layer on the pattern layer; and removing the seed layer, the first conductive material and the second conductive material being in different in material from each other.

The removing the seed layer may include using an etching solution capable of selectively removing the seed layer to remove the seed layer.

The first conductive material may include silver (Ag), and the second conductive material may include copper (Cu).

The seed layer may be provided on a release film, the forming the pattern layer may include forming a pattern groove by applying a lithography process to the pattern layer provided as a photosensitive film, the method may further include removing the pattern layer between the plating and the forming the resin layer, and the removing the seed layer may include separating the release film as the seed layer is removed.

The seed layer may be provided on a release film, the forming the pattern layer may include forming a pattern groove in the pattern layer provided as a photosensitive film, and the removing the seed layer may include separating the release film as the seed layer is removed.

The foregoing aspects of the present invention are achieved by providing a method of forming a circuit using a seed layer, including: forming a seed layer of silver (Ag) on one side of a release film; forming a seed protective layer on the seed layer; forming a pattern groove, through which the seed layer is selectively exposed, on the other side of the release film; plating the pattern groove by filling a conductive material of copper into the pattern groove; forming an insulation layer on the release film filled with the conductive material; and removing the seed layer by an etching solution capable of selectively removing the seed layer to separate the protective layer.

The foregoing aspects of the present invention are achieved by providing a method of forming a circuit using a seed layer, including: forming a resin layer on a seed layer of silver (Ag); forming a pattern by forming a pattern groove, through which the seed layer is selectively exposed, in the resin layer; plating the pattern groove by filling a conductive material of copper (Cu) into the pattern groove; forming an insulation layer on the resin layer; and removing the seed layer by an etching solution capable of selectively removing the seed layer.

The foregoing aspects of the present invention are achieved by providing a method of forming a circuit using a seed layer, including: forming a first resin layer on a seed layer of silver (Ag); forming a pattern by forming a pattern groove, through which the seed layer is selectively exposed, in the first resin layer; plating the pattern groove with a conductive material; removing the first resin layer; forming a second resin layer on the seed layer on which the conductive material is exposed as the first resin layer is removed, to prevent the conductive material from being exposed; and removing the seed layer by an etching solution capable of selectively removing the seed layer.

The foregoing aspects of the present invention are achieved by providing a method of forming a circuit using a seed layer, including: forming a seed layer of silver (Ag) on a release film; forming a protective layer on the seed layer; forming a foam-sheet layer on the protective layer; removing the release film; forming a pattern layer by applying a photosensitive material to the seed layer; forming a pattern groove on the pattern layer to selectively expose the seed layer; plating the pattern groove by filling a conductive material of copper (Cu) into the pattern groove; removing the pattern layer; forming a resin layer on the seed layer from which the pattern layer is removed; removing the foam-sheet layer; and removing the seed layer by an etching solution capable of selectively removing the seed layer to separate the protective layer.

The method may further include forming a protective layer on the seed layer before the forming the pattern layer.

The method may further include forming a through hole penetrating the seed layer in an area except the area filled with the conductive material before the removing the seed layer, so that the etching solution capable of dissolving only the seed layer can more easily contact the seed layer, thereby increasing a speed of removing the seed layer.

The foregoing aspects of the present invention are achieved by providing a method of forming a circuit using a seed layer, including: forming a first seed layer of a first conductive material on each side of a carrier member; forming a first circuit pattern by forming a pattern layer with a pattern groove, through which the first seed layer is selectively exposed, on the first seed layer and by plating the pattern groove with a second conductive material; forming a resin layer on the first circuit pattern; and removing the first seed layer to separate the carrier member by etching the first seed layer, the first conductive material and the second conductive material being different in material from each other.

The removing the first seed layer may include dissolving and removing the first seed layer by an etching solution capable of dissolving only the first conductive material.

The first conductive material may include silver (Ag), and the second conductive material may include copper (Cu).

The forming the first circuit pattern may include forming a pattern groove by applying a lithography process to the pattern layer provided as a photosensitive film, plating the pattern groove with the second conductive material, and removing the pattern layer.

The method may further include: between the forming the resin layer and the removing the first seed layer, forming a second seed layer of the first conductive material on the resin layer; and forming a second circuit pattern by forming a pattern layer with a pattern groove, through which the second seed layer is selectively exposed, on the second seed layer and by plating the pattern groove with the second conductive material.

In the forming the second circuit pattern, the pattern layer may include an edge pattern to surround a top edge of the second seed layer.

The method may further include patterning the second seed layer by removing the second seed layer exposed through the second circuit pattern.

The forming the second circuit pattern may include removing the pattern layer after plating the pattern groove with the second conductive material.

The method may further include forming a protective film on the second circuit pattern to surround an exposure surface of the second seed layer.

The method may further include removing a protective film after the removing the first seed layer.

The method may further include, between the forming the resin layer and the forming the second seed layer, forming a via hole penetrating through the second seed layer and the resin layer to expose a portion of the first circuit pattern, the second seed layer being formed as a film along a top of the resin layer and an inner wall of the via hole and electrically connected to the first circuit pattern.

The method may further include: between the forming the second seed layer and the forming the second circuit pattern, forming a via hole penetrating through the second seed layer and the resin layer to expose a portion of the first circuit pattern; and forming a current-carrying portion electrically connecting the first circuit pattern and the second seed layer by filling a conductive material in the via hole.

The method may further include, between the forming the second seed layer and the forming the via hole, forming a protective layer on the second seed layer.

The method may further include, between the forming the current carrying portion and the forming the second circuit pattern, removing the protective layer.

The foregoing aspects of the present invention are achieved by providing a method of forming a circuit using a seed layer, including: forming a first seed layer with a first conductive material of silver (Ag) on each side of a carrier member; forming a first circuit pattern with a second conductive material of copper (Cu) on the first seed layer; forming a second seed layer with the first conductive material of silver (Ag) on an inner side of a separately provided protective layer; forming a resin layer between the second seed layer and the first circuit pattern; adhering the second seed layer, the resin layer, and the first circuit pattern which are disposed in sequence; forming a via hole penetrating through the protective layer, the second seed layer, and the resin layer to expose a portion of the first circuit pattern; forming a current carrying portion electrically connecting the first circuit pattern and the second seed layer by filling a conductive material in the via hole; removing the protective layer; forming a second circuit pattern with the second conductive material on the second seed layer; and removing the first seed layer by an etching solution capable of dissolving only the first conductive material to separate the carrier member, the first conductive material and the second conductive material being different in material from each other.

The forming the resin layer may include forming the resin layer with semi-cured thermosetting resin, and the adhering includes applying both pressure and heat to cure the resin layer.

The forming the resin layer may include applying the semi-cured thermosetting resin to the inner side of the second seed layer to adhere the resin layer to the second seed layer, and the adhering may include applying both pressure and heat to cure the resin layer.

The foregoing aspects of the present invention are achieved by providing an etching solution composition for selectively removing a seed layer, used in a method of forming a circuit using the seed layer, including: 1~30 wt % of an oxidizing agent including oxidative gas, peroxides, or peracid; 1~15 wt % of aliphatic amine or aromatic amine or alkanol amine or a ammonium compound; 0.1~7 wt % of a chealate agent, defoamer, humectant, pH regulator and one or more other additives for improving etching performance of an etching solution; and water added as a remainder of a total 100 wt % of the etching solution composition.

The oxidizing agent may include at least one of oxidative gas such as air, oxygen, ozone, and the like; peroxides such as sodium perborate, hydrogen peroxide, sodium bismuthate, sodium percarbonate, benzoyl peroxide, potassium peroxide, sodium peroxide and the like; peroxy acid such as formic acid, peroxyacetic acid, perbenzoic acid, 3-chloroperoxybenzoic acid, trimethylacetic acid and the like; and potassium persulfate.

The compound may include at least one of ethylamine, propylamine, isopropylamine, n-butylamine, isobutylamine, sec-butylamine, diethylamine, piperidine, tyramine, N-methyltyramine, pyrroline, pyrrolidine, imidazole, indole, pyrimidine, ethanolamine, 6-amino-2-methyl-2-heptanol, 1-amino-2-propanol, methanolamine, dimethylethanolamine, N-methylethanolamine, 1-aminoethanol, 2-amino-2-methyl-1-propanol, ammonium carbonate, ammonium phosphate, ammonium nitrate, ammonium fluoride, and ammonium hydroxide.

According to the present invention, there is provided a method of forming a circuit using a seed layer, by which a fine pitch is achieved. Further, there is provided a method of forming a circuit using a seed layer having good adhesion and preventing a migration phenomenon.

Further, there is provided a method of forming a circuit using a seed layer, in which the seed layer is easily removed to prevent a conductive pattern from damage and decrease a defect during a process.

There is provided a method of forming a circuit using a seed layer, in which a semi additive process (SAP) method is applied to a coreless substrate manufacturing process, thereby achieving high density and film-thinness of a circuit board and preventing the circuit from damage while removing the seed layer.

The present invention is to provide an etching solution composition, with which only silver, silver alloy or a silver compound is selectively etched minimizing removal of a metal circuit layer, thereby having a high etch factor and preventing a metal circuit layer from damage.

DESCRIPTION OF SPECIFIC EMBODIMENTS OF THE INVENTION

Below, a method of forming a circuit using a seed layer according to a first embodiment of the present invention will be described in detail with reference to accompanying drawings.

Figure 1:
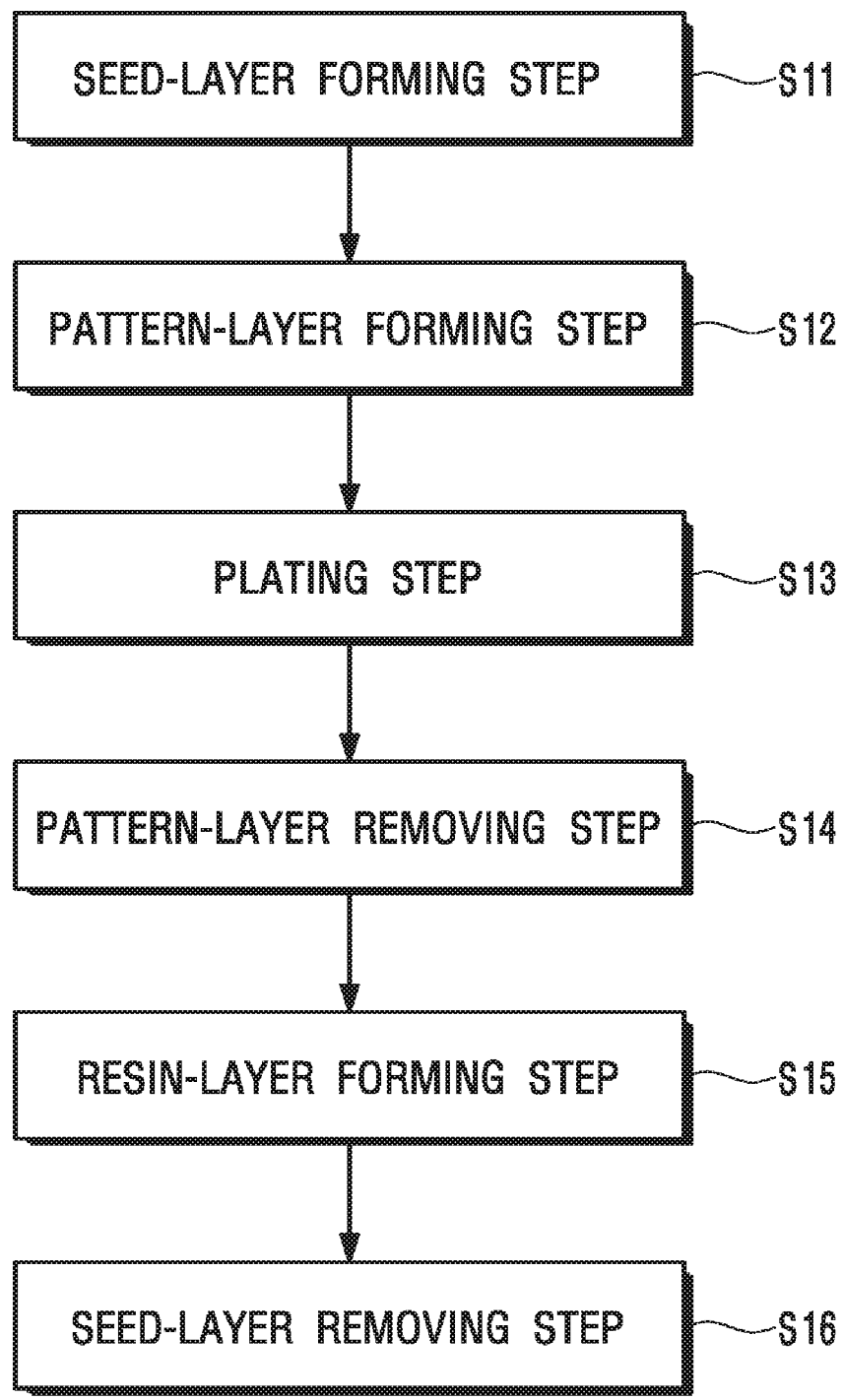
FIG. 1 is a flowchart showing a method of forming a circuit using a seed layer according to a first embodiment of the present invention.
Figure 2:
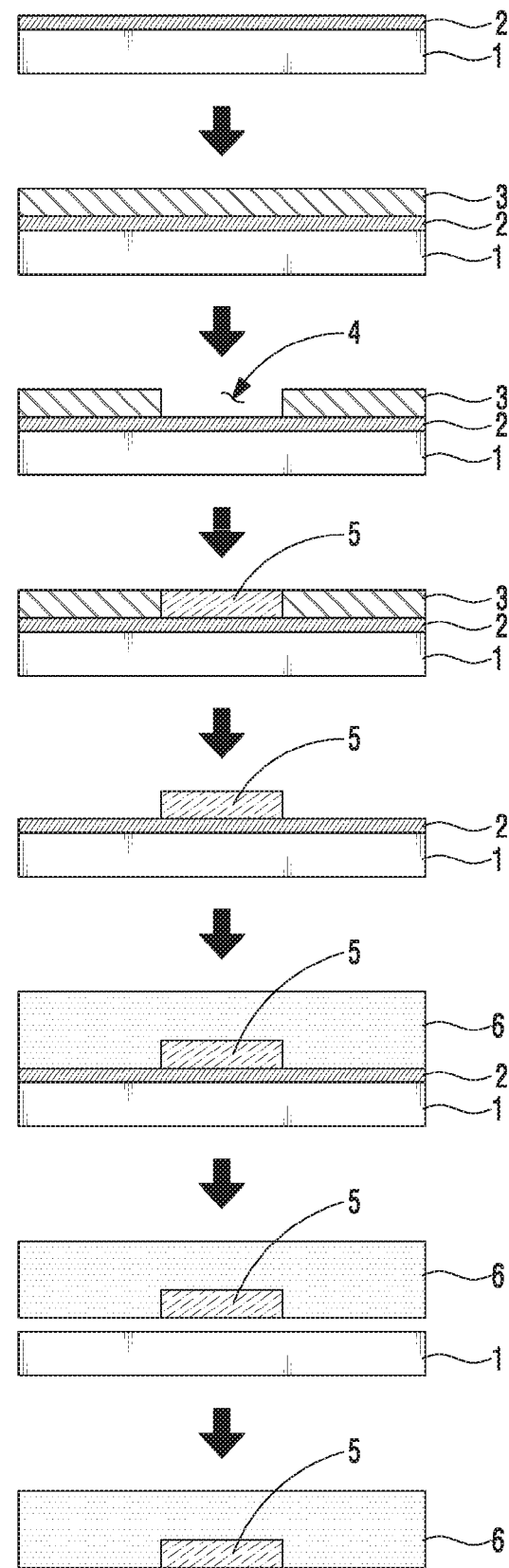
FIG. 2 is a cross-sectional view showing process steps in FIG. 1 according to the present invention.
Figure 3A:
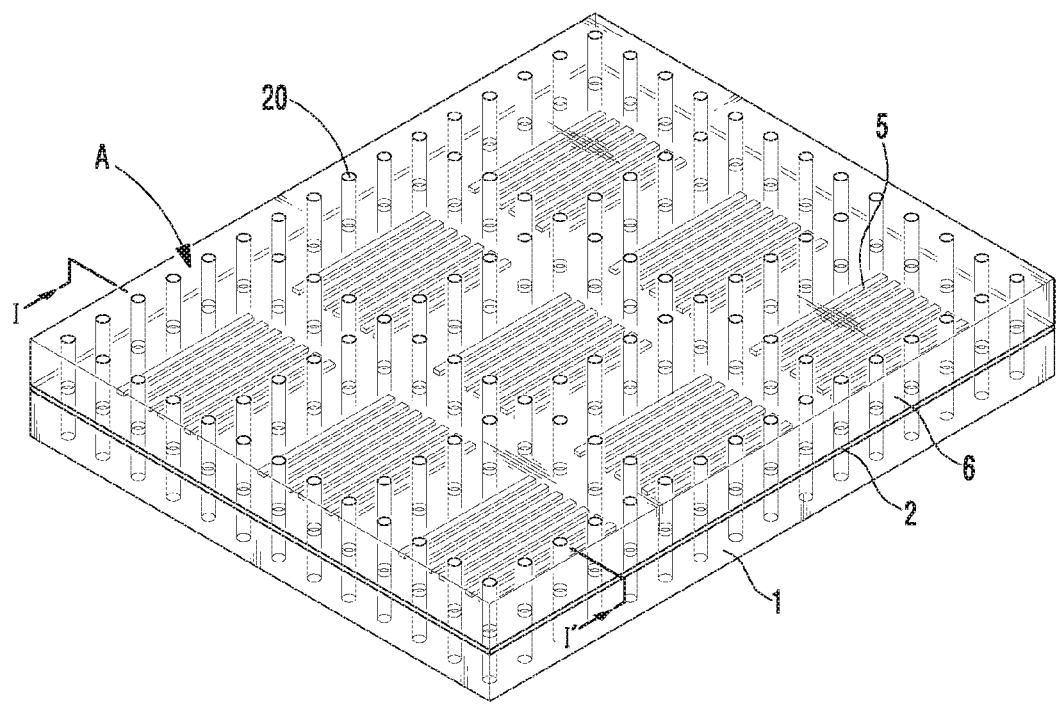
FIGS. 3(a) and 3(b) are schematic views showing a through-hole forming step according to the first embodiment of the present invention.
Figure 3B:
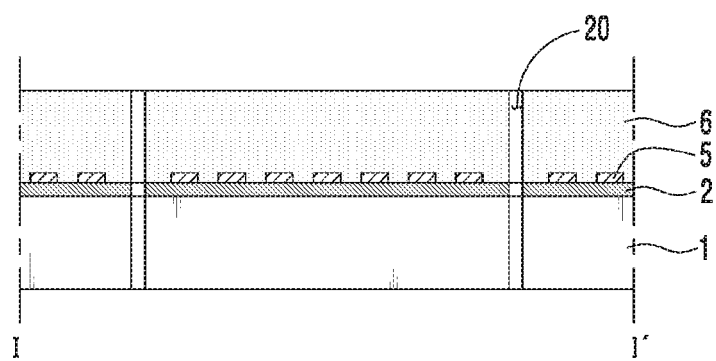

FIG. 1 is a flowchart showing a method of forming a circuit using a seed layer according to the first embodiment of the present invention, FIG. 2 is a cross-sectional view showing process steps in FIG. 1 according to the present invention, and FIGS. 3(a) and 3(b) are schematic views showing a through-hole forming step according to the first embodiment of the present invention.

As shown in FIGS. 1 and 2, a method of forming a circuit using a seed layer according to the first embodiment of the present invention includes a seed-layer forming step S11 of preparing a seed layer 2, a pattern-layer forming step S12 of forming a pattern layer 3 with a pattern groove 4, through which the seed layer 2 is exposed, on the seed layer 2, a plating step S13 of forming a circuit pattern 5 in the pattern groove 4, a pattern-layer removing step S14 of removing the pattern layer 3, a resin-layer forming step S15 of forming a resin layer 6 on the seed layer 2 from which the pattern layer 3 is removed, and a seed-layer removing step S16 of removing the seed layer 2.

In the seed-layer forming step S11, a first conductive material of silver (Ag) is applied to a release film 1, thereby preparing the seed layer 2. In the pattern-layer forming step S12, the pattern layer 3 is formed on the prepared seed layer 2. The pattern layer 3 is provided as a photosensitive material. The pattern layer 3 provided as the photosensitive material is formed with the pattern groove 4 through which the seed layer 2 of a conductive layer is selectively exposed by a lithography process. Therefore, the seed layer 2 is selectively exposed through the pattern groove 4 of the pattern layer 3 according to a pattern desired to form a circuit.

The first conductive material of the seed layer 2 may contains silver (Ag), silver alloy or a silver compound. Further, a method of forming the seed layer 2 in the seed-layer forming step S11 may include sputtering, chemical vapor deposition (CVD), electroless plating, coating, a dipping process, and any universal process capable of forming metal, metal alloy, or a metal compound, and there are no specific limits to the seed-layer forming process.

Then, in the plating step S13, the inside of the pattern groove 4 is plated with a second conductive material to form the circuit pattern 5. In this case, the second conductive material may be provided as copper having very high electrical conductivity. In the plating step S13, the seed layer 2 exposed through the pattern groove 4 serves as an electrode, so that the inside of the pattern groove 4 can be formed with the circuit pattern 5 by an electroplating process.

Then, in the pattern-layer removing step S14, the pattern layer 3 is removed. The pattern layer 3 is removed except the circuit pattern 5 filled in the pattern groove 4, thereby leaving the circuit pattern 5 on the seed layer 2.

Next, in the resin-layer forming step S15, the resin layer 6 is formed on the seed layer 2. Resin is applied and then either heat or pressure or both heat and pressure are applied to the resin, thereby forming the resin layer 6 on the seed layer 2.

In the seed-layer removing step S16, the seed layer 2 is removed, so that the circuit pattern 5 formed in the plating step S13 can be transferred to the resin layer 6. In other words, the circuit pattern 5 provided in the seed layer 2 is left on the resin layer 6, and the seed layer 2 is removed to thereby form the circuit pattern 5 as desired on the resin layer 6. Here, a method of removing the seed layer 2 includes a chemical method of using an etching solution capable of dissolving only the seed layer 2 of silver (Ag). Because the release film 1 is separated as only the seed layer 2 is dissolved and removed, an additional process for removing the release film 1 is not necessary. Further, the etching solution for dissolving the seed layer 2 is provided to dissolve only silver (Ag) without damaging the circuit pattern 5 of copper.

That is, the seed layer 2 and the circuit pattern 5 have conventionally been made of copper, and it is thus impossible to use a chemical method in selectively removing only the seed layer 2. On the other hand, according to the present invention, the seed layer 2 is made of silver (Ag), and the etching solution capable of dissolving only silver (Ag) is used in selectively removing the seed layer 2, thereby making it very simple to remove the seed layer 2. In additional, it is possible to prevent the circuit pattern 5 from physical damage that may occur when the seed layer is removed by a conventional physical method.

Meanwhile, a through-hole forming step of forming a through hole 20 penetrating the seed layer 2 in a dummy area A, i.e. an area except an area, in which the circuit pattern 5 is formed, may be provided before removing the seed layer 2. FIGS. 3(a) and 3(b) are schematic views showing that the through hole is formed. As shown therein, in the through-hole forming step, the through hole penetrating the seed layer 2 may be formed in the dummy area A, where a product is not actually formed, by punching or the like method, so that the etching solution capable of dissolving only silver (Ag) can more easily permeate the seed layer 2.

The seed-layer removing step S16 employs a dipping method of dipping a product being subjected to a process into the etching solution to remove the seed layer 2. In this case, when the through hole is not present, only the seed layer 2 exposed to the outer surface of the product being subjected to the process is in contact with the etching solution, and therefore it takes long time to remove the seed layer 2. On the other hand, when the through hole 20 is present, the through hole 20 makes the etching solution be in contact with the seed layer 2 of an inner area, thereby reducing time taken in removing the seed layer 2.

Next, a method of forming a circuit using a seed layer according to a second embodiment of the present invention will be described.

Figure 4:
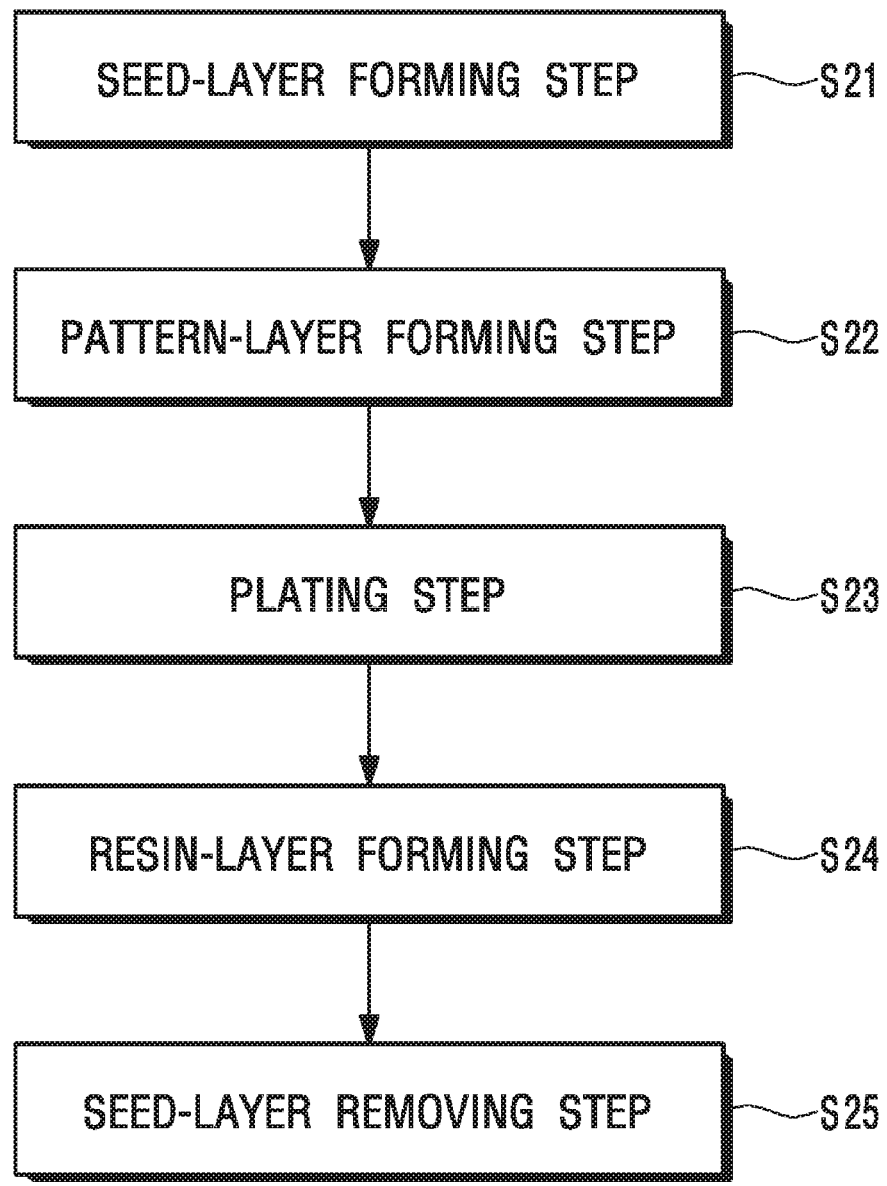
FIG. 4 is a flowchart showing a method of forming a circuit using a seed layer according to a second embodiment of the present invention.
Figure 5:
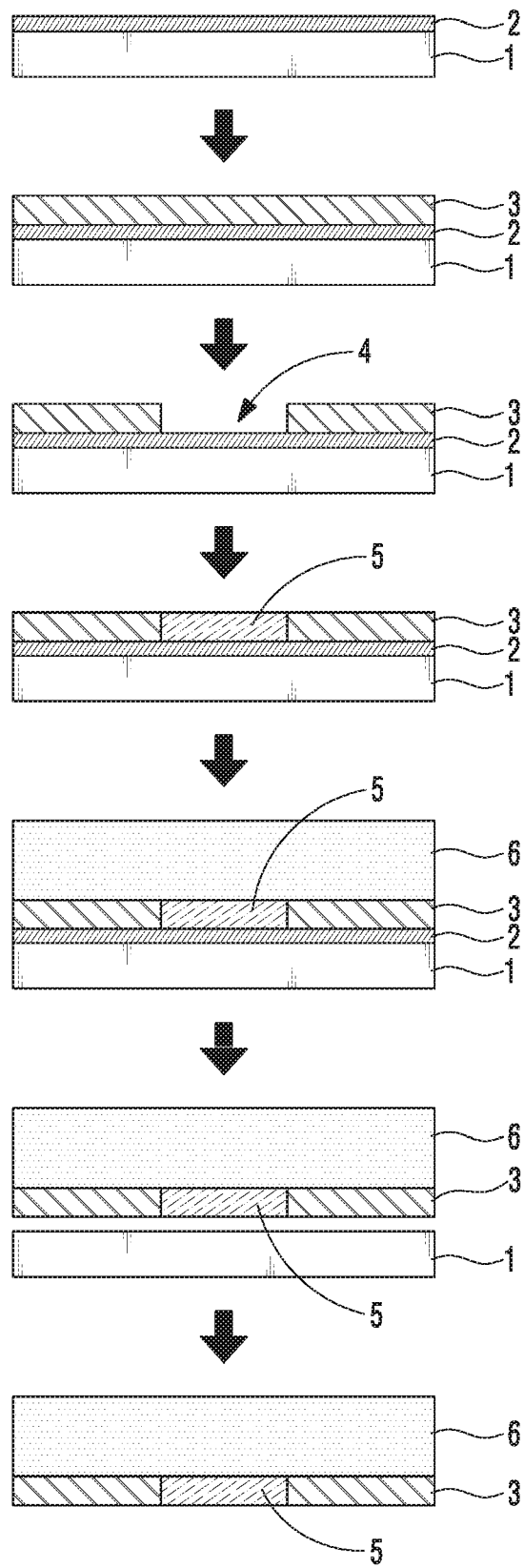
FIG. 5 is a cross-sectional view showing process steps in FIG. 4 according to the present invention.

FIG. 4 is a flowchart showing a method of forming a circuit using the seed layer according to a second embodiment of the present invention, and FIG. 5 is a cross-sectional view showing process steps in FIG. 4 according to the present invention.

As shown therein, the method of forming the circuit using the seed layer according to the second embodiment of the present invention includes a seed-layer forming step S21 of preparing a seed layer 2 of a first conductive material, a pattern-layer forming step S22 of forming a pattern layer 3 with a pattern groove 4, through which the seed layer 2 is selectively exposed, on the seed layer 2, a plating step S23 of filling the pattern groove 4 with a circuit pattern 5 of a second conductive material, a resin-layer forming step S24 of forming a resin layer 6 on the pattern layer 3, and a seed-layer removing step S25 of removing the seed layer 2.

In the seed-layer forming step S21, the first conductive material of silver (Ag) is applied onto the release film 1, thereby preparing the seed layer 2. In the pattern-layer forming step S22, the pattern layer 3 is formed on the prepared seed layer 2. The pattern layer 3 is provided as a photosensitive material, and forms the pattern groove 4, through which the seed layer 2 of a conductive layer is selectively exposed, is formed by applying a lithography process to the photosensitive material. Therefore, the seed layer 2 is exposed through the pattern groove 4 of the pattern layer 3 according to a pattern desired to form a circuit.

Then, in the plating step S23, the second conductive material is plated so that the circuit pattern 5 can be formed inside the pattern groove 4. In this case, the second conductive material is copper unlike the seed layer 2. In the plating step S23, the seed layer 2 exposed through the pattern groove 4 serves as an electrode, and therefore makes the circuit pattern 5 be formed inside the pattern groove 4 by an electroplating process.

Then, in the resin-layer forming step S24, the resin layer 6 is formed on the pattern layer 3. In other words, either heat or pressure or both heat and pressure are applied to resin, thereby applying the resin layer 6 onto the pattern layer 3.

In the seed-layer removing step S25, the seed layer 2 is removed. As the seed layer 2 is removed, the circuit pattern 5 formed in the plating step S23 is transferred to the resin layer 6. In other words, the circuit pattern 5 provided on the seed layer 2 is left on the resin layer 6 and the seed layer 2 is removed, thereby forming the circuit pattern 5 on the resin layer 6. Here, the seed layer 2 is removed by the same method as that of the first embodiment. Further, like the first embodiment, the second embodiment may also include a through-hole forming step before the seed-layer removing step S25.

Next, a method of forming a circuit using a seed layer according to a third embodiment of the present invention will be described.

Figure 6:
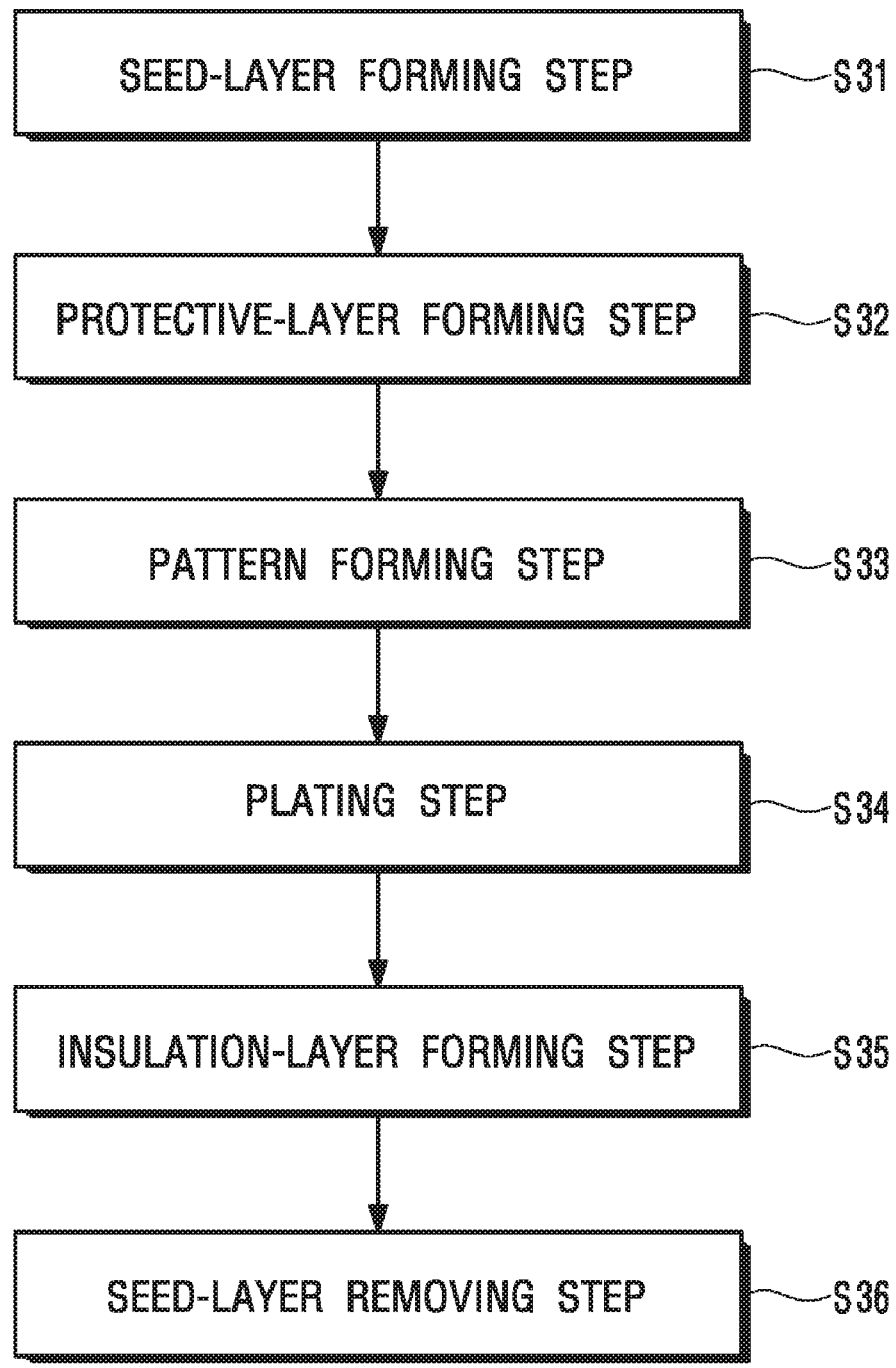
FIG. 6 is a flowchart showing a method of forming a circuit using a seed layer according to a third embodiment of the present invention.
Figure 7:
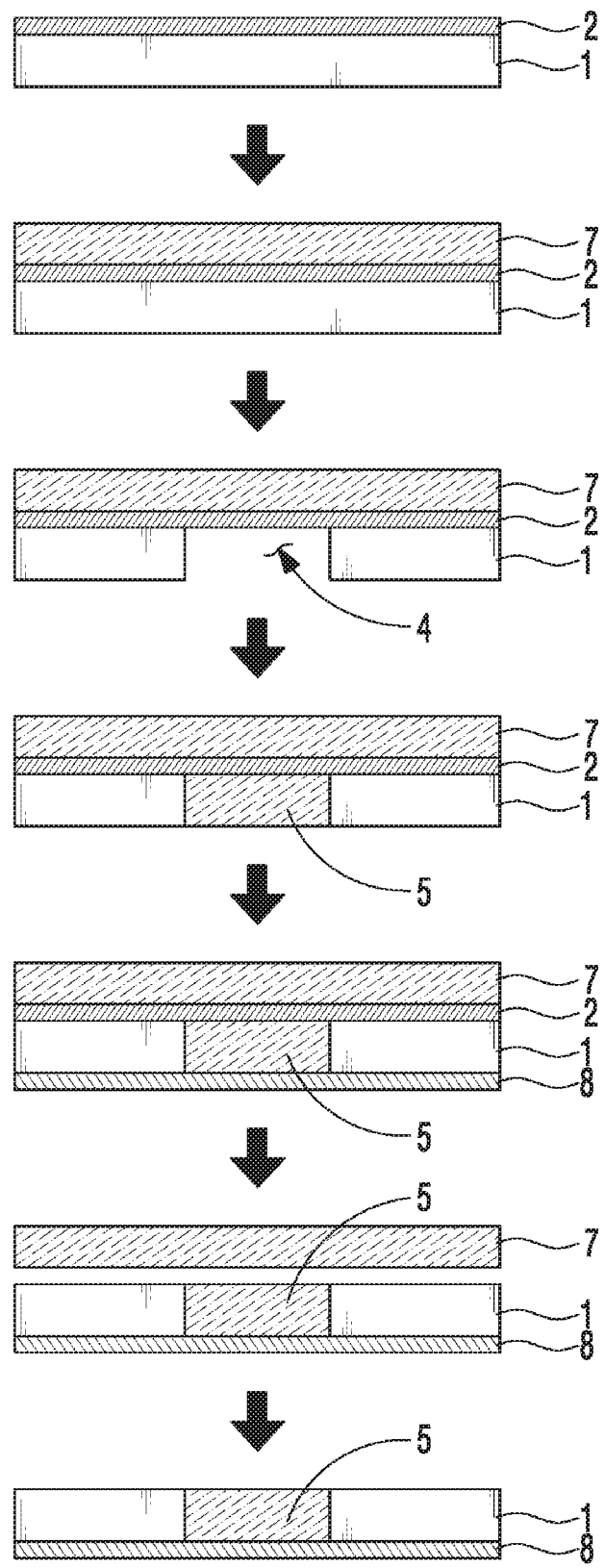
FIG. 7 is a cross-sectional view showing process steps in FIG. 6 according to the present invention.

FIG. 6 is a flowchart showing a method of forming a circuit using a seed layer according to the third embodiment of the present invention, and FIG. 7 is a cross-sectional view showing process steps in FIG. 6 according to the present invention.

As shown therein, the method of forming the circuit using the seed layer according to the third embodiment of the present invention includes a seed-layer forming step S31 of forming a seed layer 2 of a first conductive material on one side of a release film 1, a protective-layer forming step S32 of applying a protective layer 7 onto the seed layer 2, a pattern forming step S33 of forming a pattern groove 4, through which the seed layer 2 is selectively exposed, on a the other side of the release film 1, a plating step S34 of forming a circuit pattern 5 of a second conductive material on the inside of the pattern groove 4, an insulation-layer forming step S35 of forming an insulation layer 8 on the other side of the release film 1, and a seed-layer removing step S36 of removing the seed layer 2.

In the seed-layer forming step S31, the first conductive material of silver (Ag) is applied onto one side of the release film 1, thereby forming the seed layer 2. Then, in the protective-layer forming step S32, the protective layer 7 for protecting the seed layer 2 is formed. Because the seed layer 2 is very thinly formed, the protective layer 7 serves to prevent the seed layer 2 from damage in the following process. The protective layer 7 may be formed on the seed layer 2 by a copper plating process.

Then, in the pattern forming step S33, the pattern groove 4 is formed on the opposite side to the side of the release film 1 on which the seed layer 2 is formed. In other words, the pattern groove 4 is formed on the release film 1 by a laser process or the like so that the seed layer 2 can be selectively exposed through the pattern groove 4.

Then, in the plating step S34, the second conductive material of copper is filled in the pattern groove 4 of the release film 1 by a plating process, thereby forming the circuit pattern 5.

In the insulation-layer forming step S35, the insulation layer 8 is formed on the release film 1 formed with the circuit pattern 5. Then, the seed-layer removing step S36 of removing the seed layer 2 is carried out to form the circuit. Here, the seed-layer removing step S36 is the same as that of the first embodiment, and the protective layer 7 is also removed because the seed layer 2 is dissolved and removed.

Further, like the first embodiment, the third embodiment may also include a through-hole forming step before the seed-layer removing step S36.

Next, a method of forming a circuit using a seed layer according to a fourth embodiment of the present invention will be described.

Figure 8:
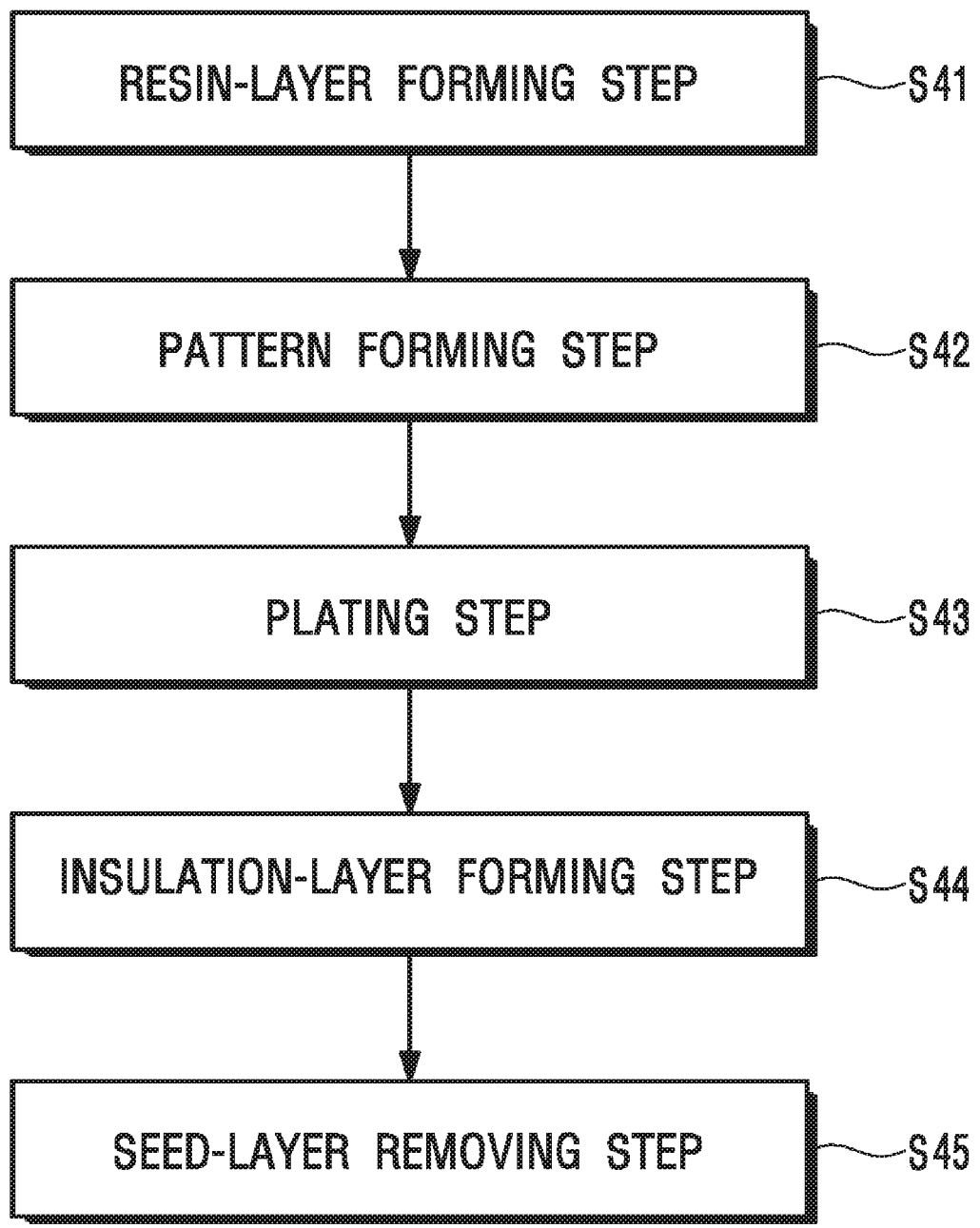
FIG. 8 is a flowchart showing a method of forming a circuit using a seed layer according to a fourth embodiment of the present invention.
Figure 9:
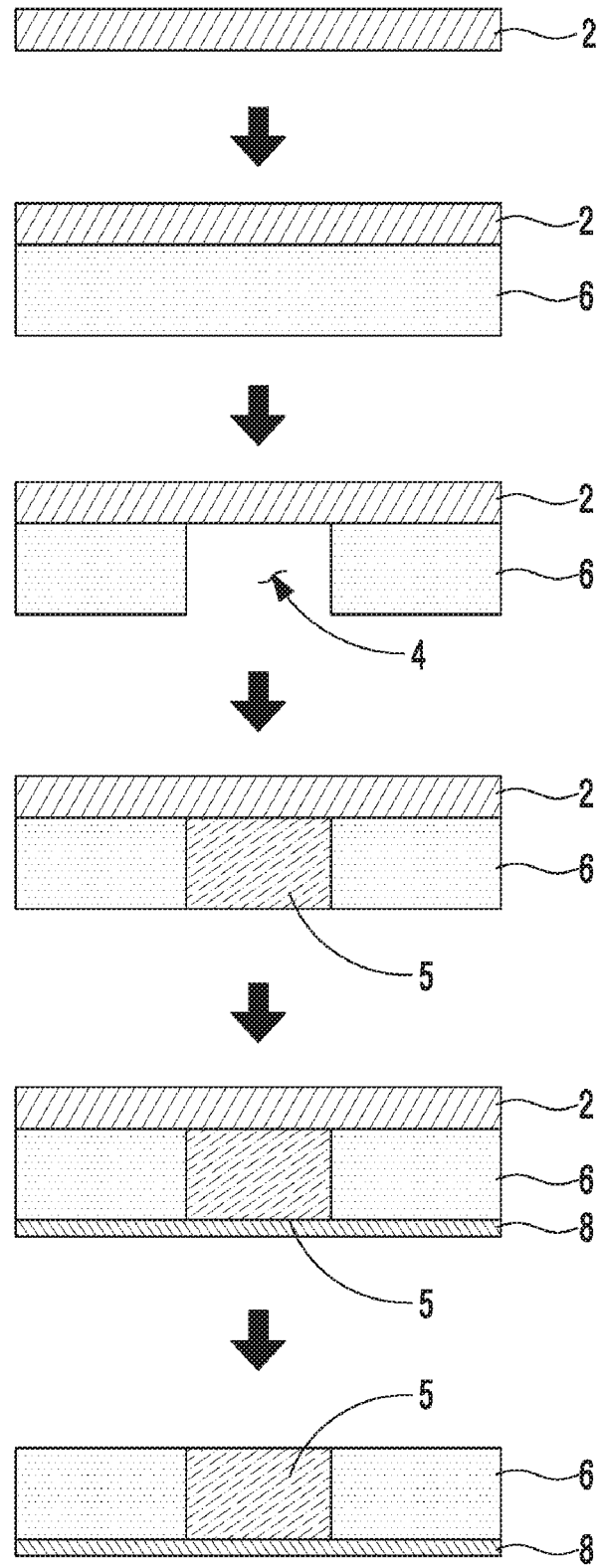
FIG. 9 is a cross-sectional view showing process steps in FIG. 8 according to the present invention.

FIG. 8 is a flowchart showing a method of forming a circuit using a seed layer according to the fourth embodiment of the present invention, and FIG. 9 is a cross-sectional view showing process steps in FIG. 8 according to the present invention, As shown therein, the method of forming the circuit using the seed layer according to the fourth embodiment of the present invention includes a resin-layer forming step S41 of applying a resin layer 6 onto a seed layer 2 of a first conductive material, a pattern forming step S42 of forming a pattern groove 4 on the resin layer 6, a plating step S43 of forming a circuit pattern 5 of a second conductive material on the inside of the pattern groove 4, an insulation-layer forming step S44 of forming an insulation layer 8 onto the resin layer 6, and a seed-layer removing step S45 of removing the seed layer 2.

In the resin-layer forming step S41, the resin layer 6 is laminated onto the seed layer 2 made of the first conductive material of silver (Ag) and having a predetermined thickness. As the resin layer 6, poly imide (PI) resin is used.

In the pattern forming step S42, the pattern groove 4, through which the seed layer 2 is selectively exposed, is formed in the resin layer 6. A pattern forming method may include a laser process for forming the pattern groove 4, and other methods such as lithography when photosensitive resin is used. In the plating step S43, the inside of the pattern groove 4 is plated with the second conductive material of copper to form the circuit pattern 5.

In the insulation-layer forming step S44, the insulation layer 8 is formed on both the circuit pattern 5 and the resin layer 6. Then, the seed-layer removing step S45 of removing the seed layer 2 is carried out to form the circuit. Here, the seed-layer removing step S45 is performed by the same method as the seed-layer removing step S16 of the first embodiment. Further, like the first embodiment, the fourth embodiment may also include a through-hole forming step before the seed-layer removing step S45.

Next, a method of forming a circuit using a seed layer according to a fifth embodiment of the present invention will be described.

Figure 10:
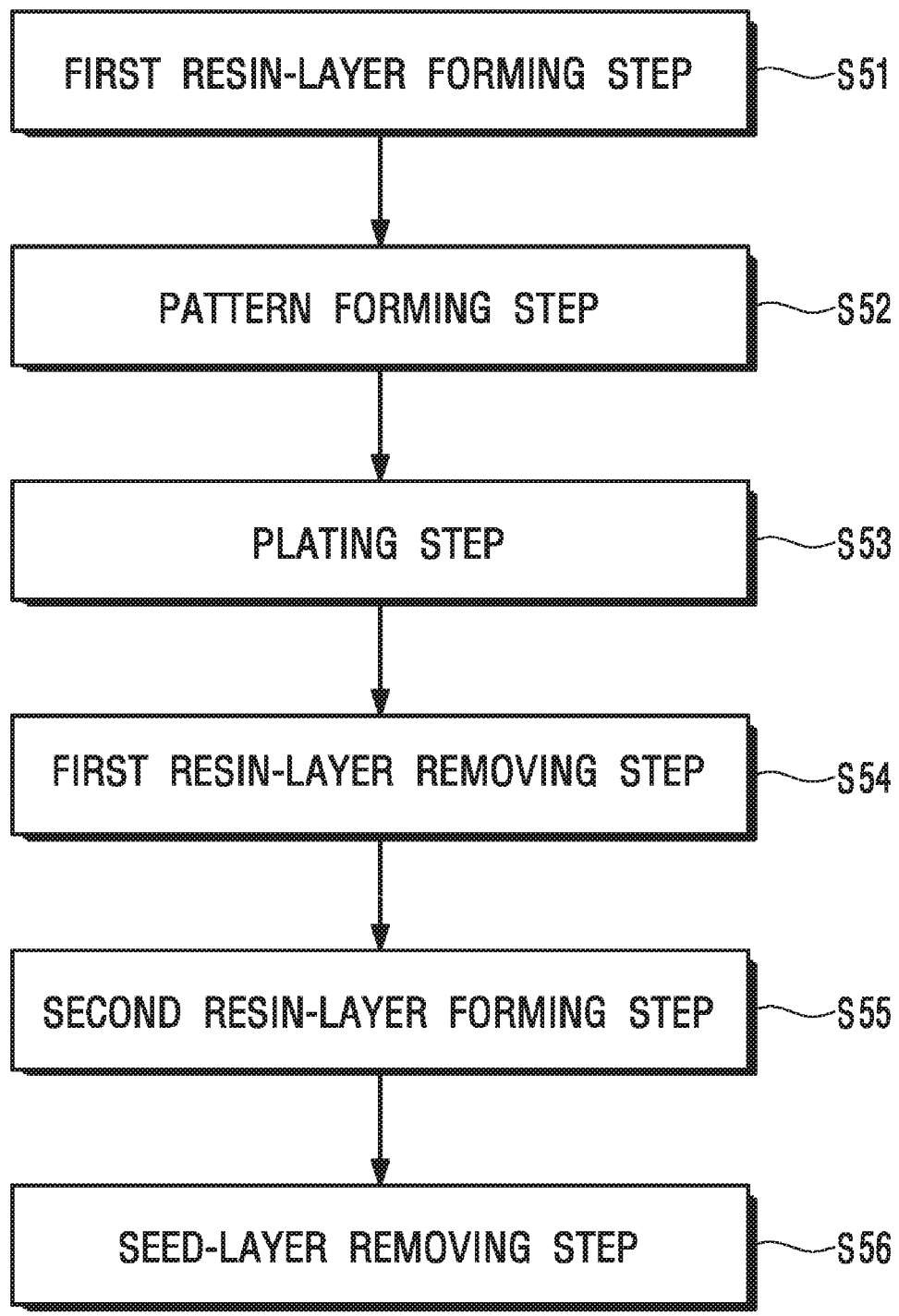
FIG. 10 is a flowchart showing a method of forming a circuit using a seed layer according to a fifth embodiment of the present invention.
Figure 11:
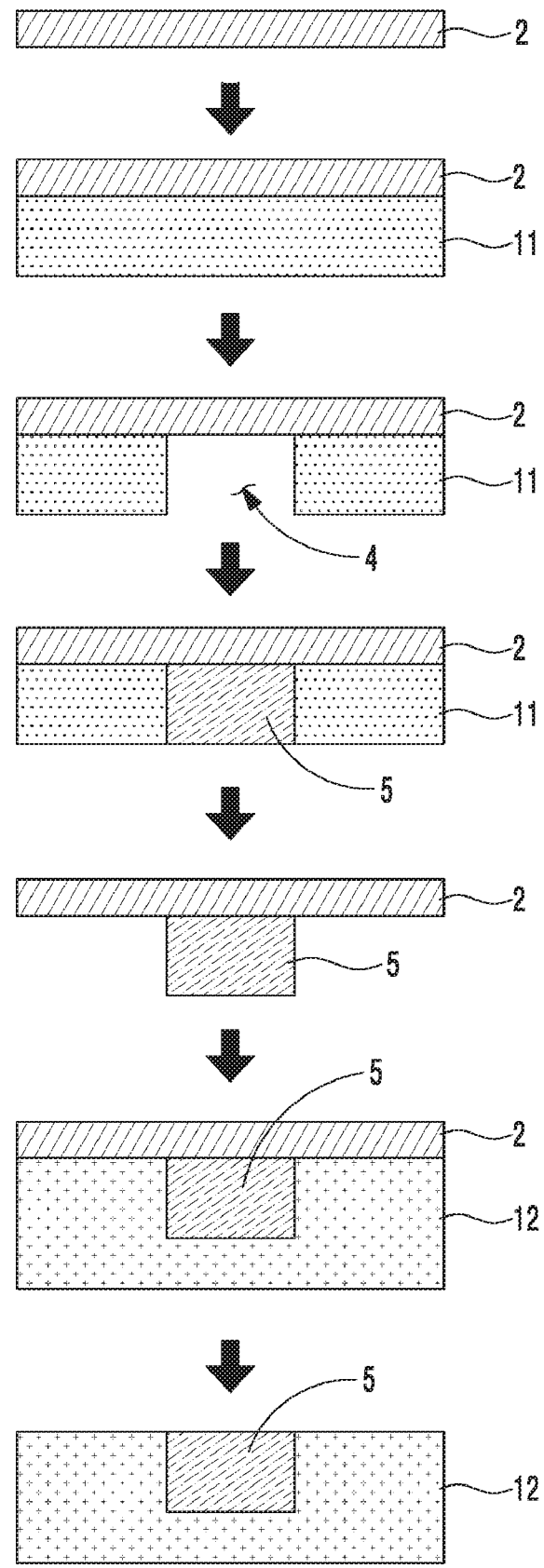
FIG. 11 is a cross-sectional view showing process steps in FIG. 10 according to the present invention.

FIG. 10 is a flowchart showing a method of forming a circuit using a seed layer according to the fifth embodiment of the present invention, and FIG. 11 is a cross-sectional view showing process steps in FIG. 10 according to the present invention.

As shown therein, the method of forming the circuit using the seed layer according to the fifth embodiment of the present invention includes a first resin-layer forming step S51 of applying a first resin layer 11 onto a seed layer 2 made of a first conductive material of silver (Ag), a pattern forming step S52 of forming a pattern groove 4 on the first resin layer 11, a plating step S53 of forming a circuit pattern 5 by filling a second conductive material of copper (Cu) in the pattern groove 4, a first resin-layer removing step S54 of removing the first resin layer 11, a second resin-layer forming step S55 of forming a second resin layer 12 on the seed layer 2, and a seed-layer removing step S56 of removing the seed layer 2.

In the first resin-layer forming step S51, the first resin layer 11 is laminated onto the seed layer 2 made of silver (Ag) and having a predetermined thickness. As the resin, poly imide (PI) resin is used.

In the pattern forming step S52, the pattern groove 4 is formed on the first resin layer 11 so that the seed layer 2 can be selectively exposed. A pattern forming method may include a laser process for forming the pattern groove, and other methods such as lithography when photosensitive resin is used. In the plating step S53, the second conductive material of copper is filled inside the pattern groove 4 to thereby form the circuit pattern 5.

In the first resin-layer removing step S54, the first resin layer 11 formed on the seed layer 2 is removed. In this case, the circuit pattern 5 filled in the pattern groove 4 is left on the seed layer 2, and only the first resin layer 11 is removed.

In the second resin-layer forming step S55, the second resin layer 12 is formed to cover the circuit pattern 5 over so that the circuit pattern 5 formed on the seed layer 2 cannot to be exposed to the outside. Like the first resin layer 11, the second resin layer 12 may also be provided as the PI resin.

Then, in the seed-layer removing step S56, the seed layer 2 of silver (Ag) is removed, thereby transferring the circuit pattern 5 onto the second resin layer 12. Here, the seed-layer removing step S56 is carried out by the same method as the seed-layer removing step S16 of the first embodiment. Further, even in the fifth embodiment, a through-hole forming step may also be given before the seed-layer removing step S56 like the first embodiment.

Next, a method of forming a circuit using a seed layer according to a sixth embodiment of the present invention will be described.

Figure 12:
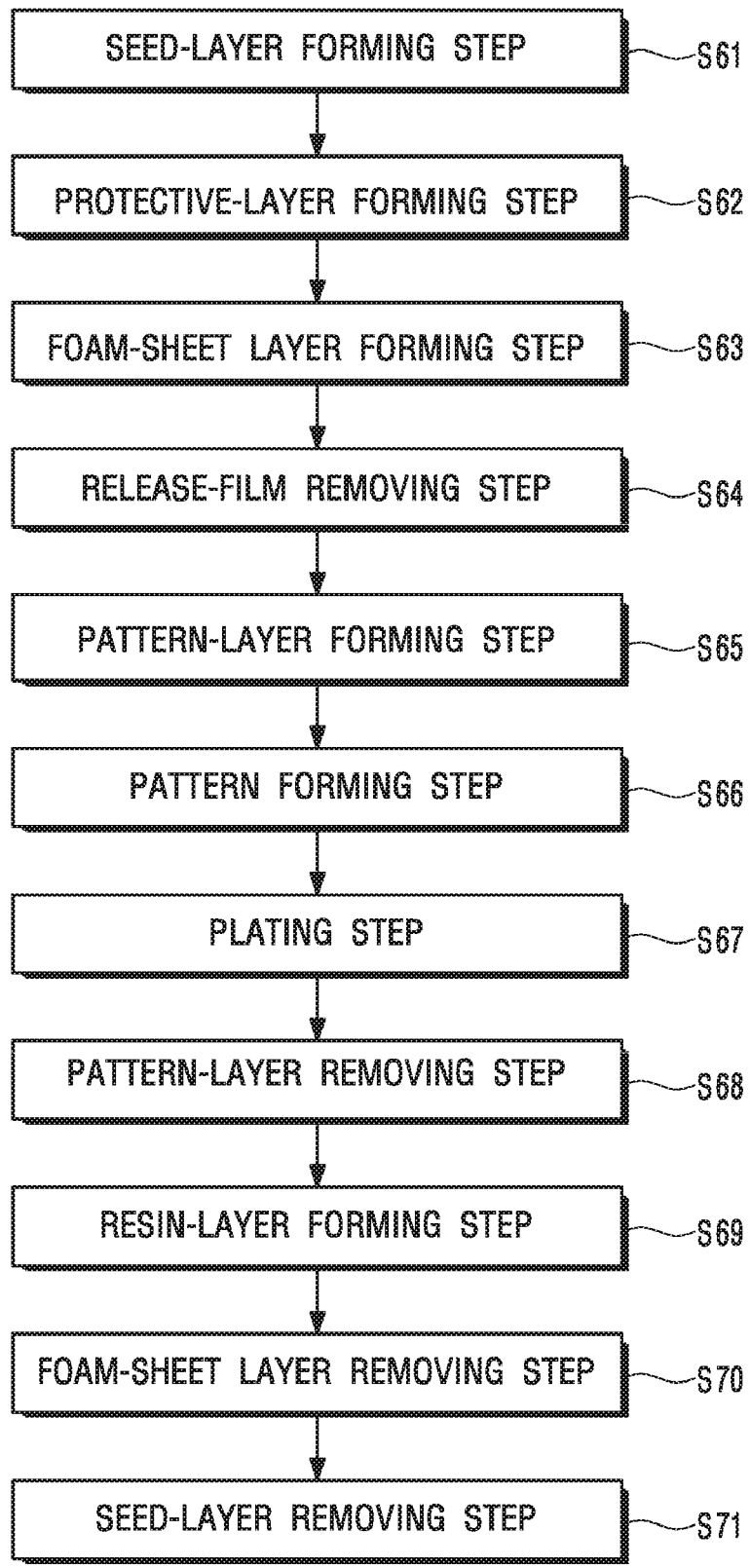
FIG. 12 is a flowchart showing a method of forming a circuit using a seed layer according to a sixth embodiment of the present invention.
Figure 13:
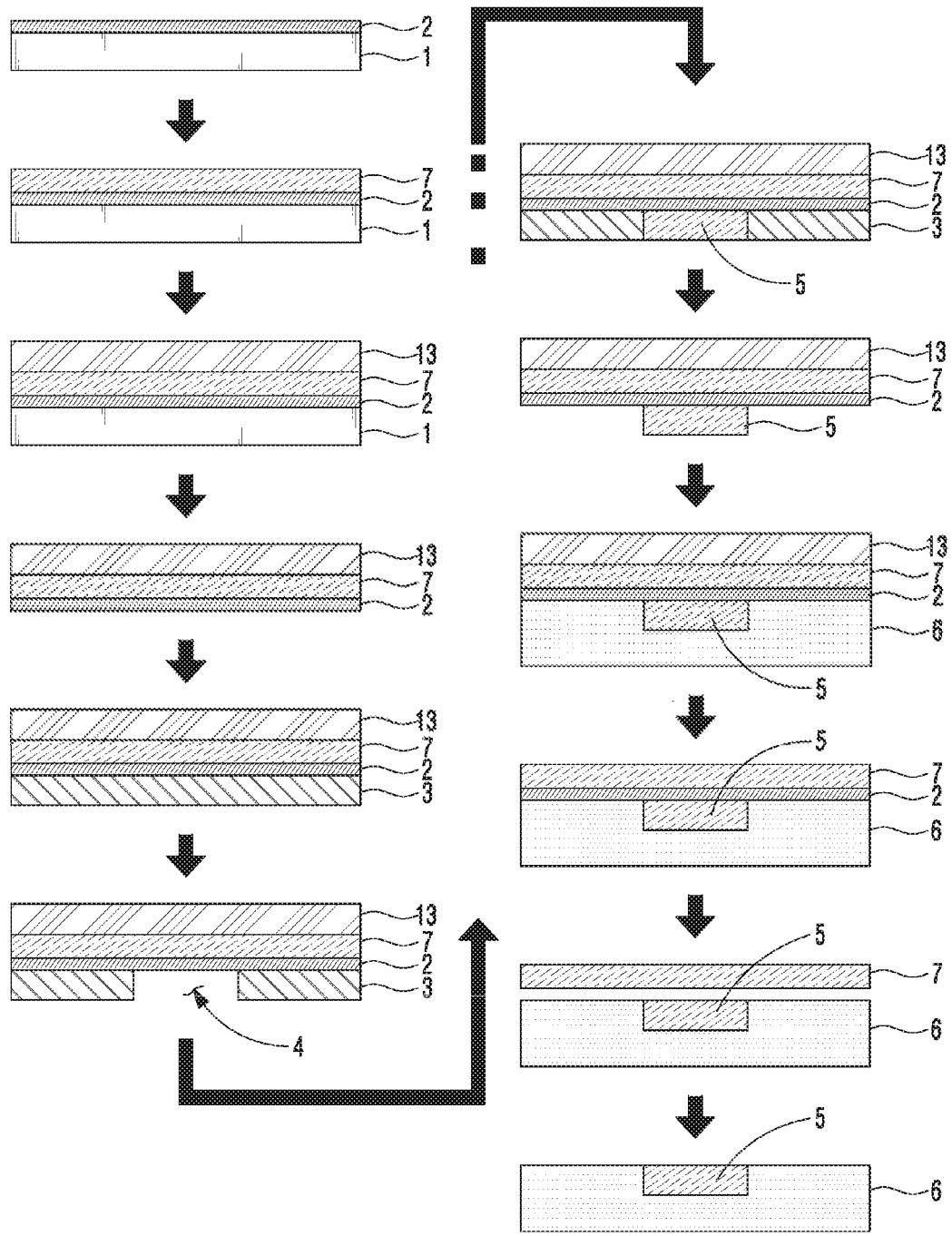
FIG. 13 is a cross-sectional view showing process steps in FIG. 12 according to the present invention.

FIG. 12 is a flowchart showing a method of forming a circuit using a seed layer according to the sixth embodiment of the present invention, and FIG. 13 is a cross-sectional view showing process steps in FIG. 12 according to the present invention.

As shown therein, the method of forming the circuit using the seed layer according to the sixth embodiment of the present invention includes a seed-layer forming step S61 of forming a seed layer 2 made of a first conductive material of silver (Ag) on a release film 1, a protective-layer forming step S62 of forming a protective layer 7 on the seed layer 2, a foam-sheet layer forming step S63 of forming a foam-sheet layer 13 onto the protective layer 7, a release-film removing step S64 of removing the release film 1, a pattern-layer forming step S65 of forming a pattern layer 3 by applying a photosensitive material onto the seed layer 2, a pattern forming step S66 of forming a pattern groove 4 on the pattern layer 3 so that the seed layer 2 can be selectively exposed, a plating step S67 of forming a circuit pattern 5 by filling a conductive material of copper (Cu) in the pattern groove 4, a pattern-layer removing step S68 of removing the pattern layer 3, a resin-layer forming step S69 of forming a the resin layer 6 on the seed layer 2, a foam-sheet layer removing step S70 of removing the foam-sheet layer 13, and a seed-layer removing step S71 of removing the seed layer 2.

In the seed-layer forming step S61, the first conductive material of silver (Ag) is applied onto the release film 1, thereby forming the seed layer 2. Then, in the protective-layer forming step S62, a protective layer 7 of copper (Cu) is formed by a plating process to protect the seed layer 2.

Then, in the foam-sheet layer forming step S63, the foam-sheet layer 13 is formed on the protective layer 7. The foam-sheet layer 13 may use an aluminum sheet. With this, the seed layer 2 is more firmly protected, and plating is more smoothly achieved.

Next, the release film 1 is removed in the release-film removing step S64, and the pattern layer 3 is formed by applying the photosensitive material onto the seed layer 2, from which the release film 1 is removed, in the pattern-layer forming step S65. Then, in the pattern forming step S66, the pattern groove 4, through which the seed layer 2 is selectively exposed, is formed on the pattern layer 3 by the lithography process.

In the plating step S67, the second conductive material of copper (Cu) is filled inside the pattern groove 4 by a plating process, thereby forming the circuit pattern 5. Then, in the pattern-layer removing step S68, the pattern layer 3 is removed leaving only the circuit pattern 5 on the seed layer 2.

In the resin-layer forming step S69, the resin layer 6 is formed to fully cover the circuit pattern 5 left on the seed layer 2 from which the pattern layer 3 is removed.

Then, the foam-sheet layer 13 and the seed layer 2 are respectively removed in the foam-sheet layer removing step S70 and the seed-layer removing step S71, thereby transferring the circuit pattern 5 to the resin layer 6. Here, the seed-layer removing step S71 is carried out by the same method as the seed-layer removing step S16 of the first embodiment, and the protective layer 7 is also separated as the seed layer 2 is dissolved. Further, like the first embodiment, the sixth embodiment may also include a through-hole forming step before the seed-layer removing step S71.

Next, seventh and eighth embodiments of the present invention will be described.

Figure 14:
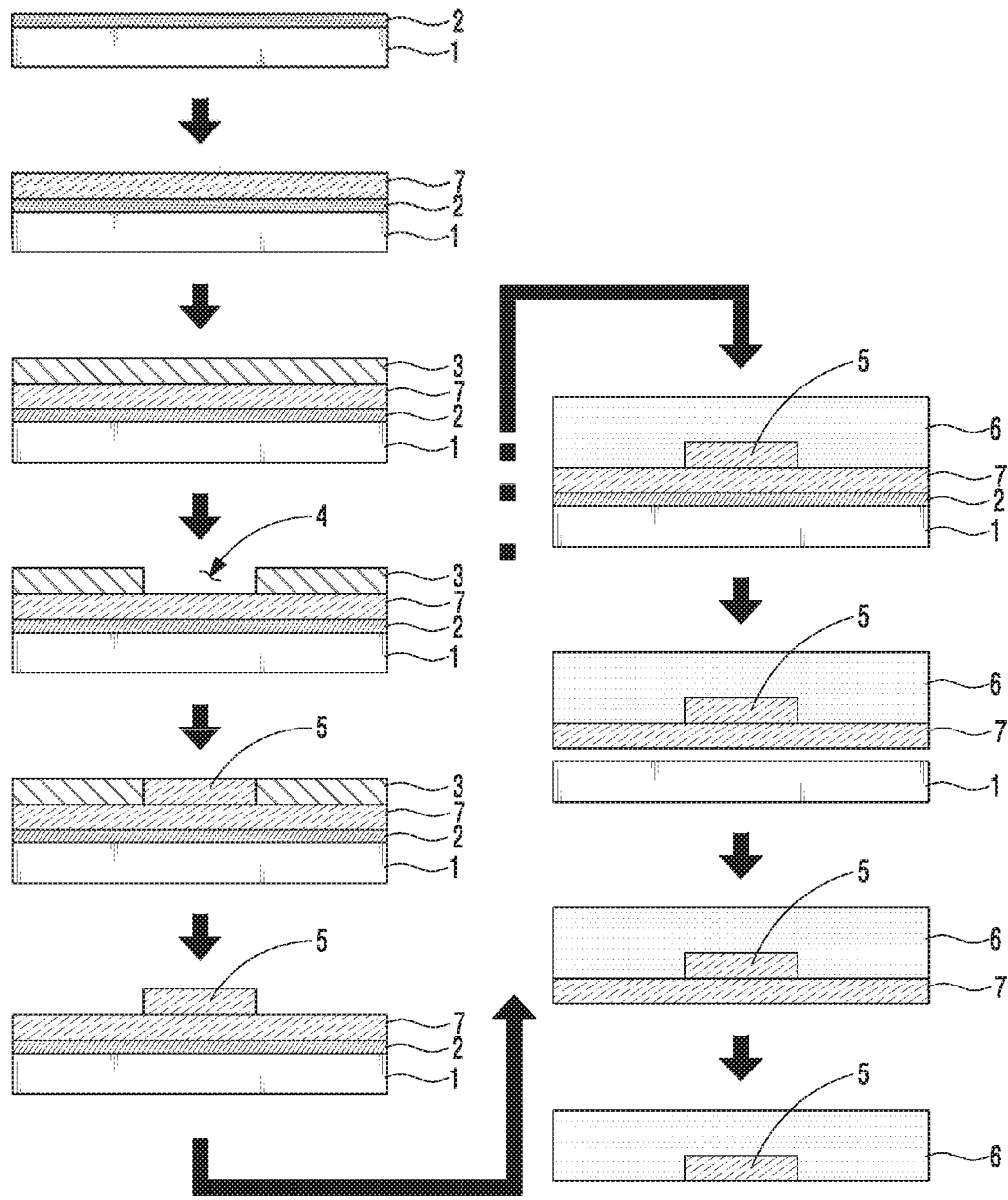
FIG. 14 is a cross-sectional view showing process steps of a method of forming a circuit using a seed layer according to a seventh embodiment of the present invention.
Figure 15:
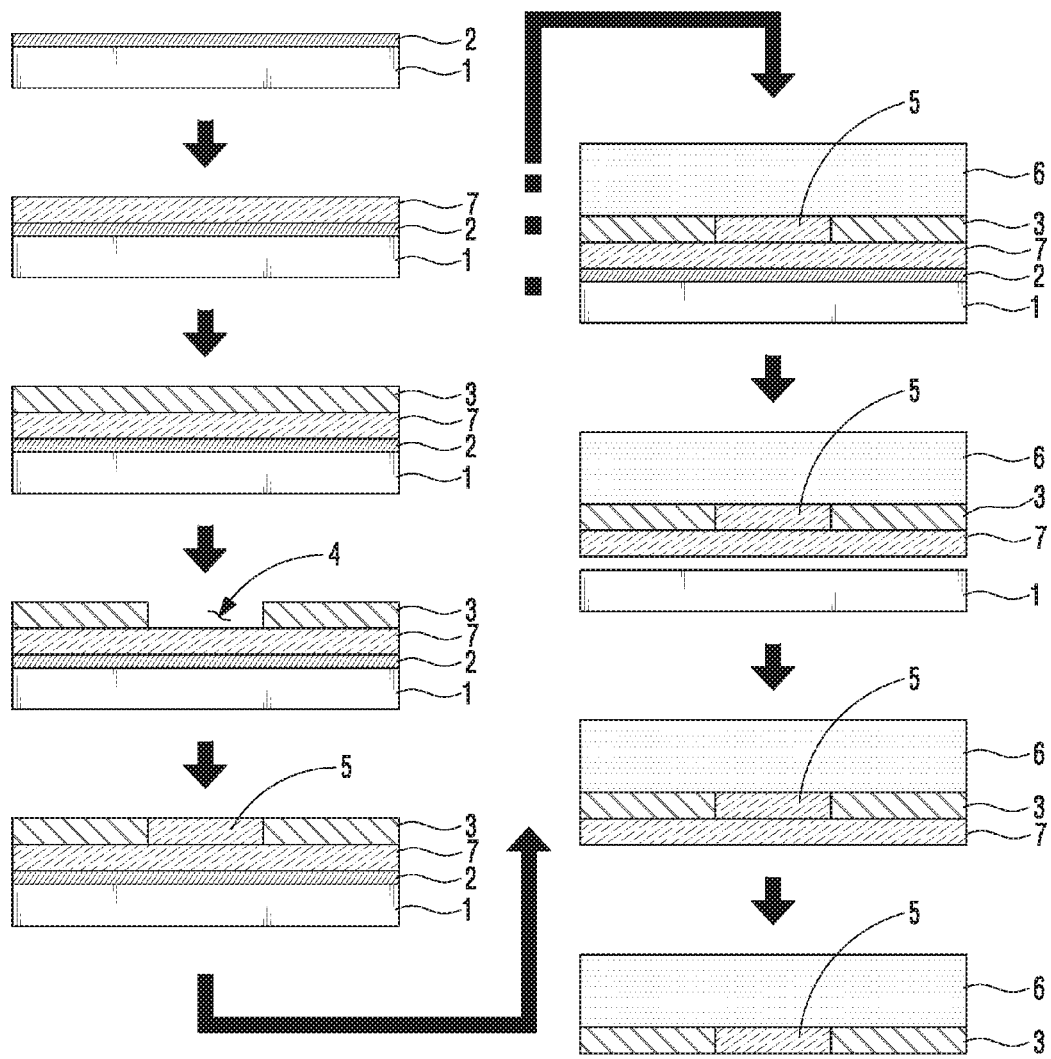
FIG. 15 is a cross-sectional view showing process steps of a method of forming a circuit using a seed layer according to an eighth embodiment of the present invention.

FIG. 14 is a cross-sectional view showing process steps of a method of forming a circuit using a seed layer according to a seventh embodiment of the present invention, and FIG. 15 is a cross-sectional view showing process steps of a method of forming a circuit using a seed layer according to an eighth embodiment of the present invention.

The seventh and eighth embodiments of the present invention further include a protective-layer forming step of forming a protective layer 7 on a seed layer 2 between the seed-layer forming step S11 or S21 and the pattern-layer forming step S12 or S22 of the first and second embodiments of the present invention. By plating the seed layer 2 with the protective layer 7 of copper (Cu), the seed layer 2 is protected, and a plating process is more smoothly achieved in the following plating process.

Next, a ninth embodiment of the present invention will be described.

Figure 16:
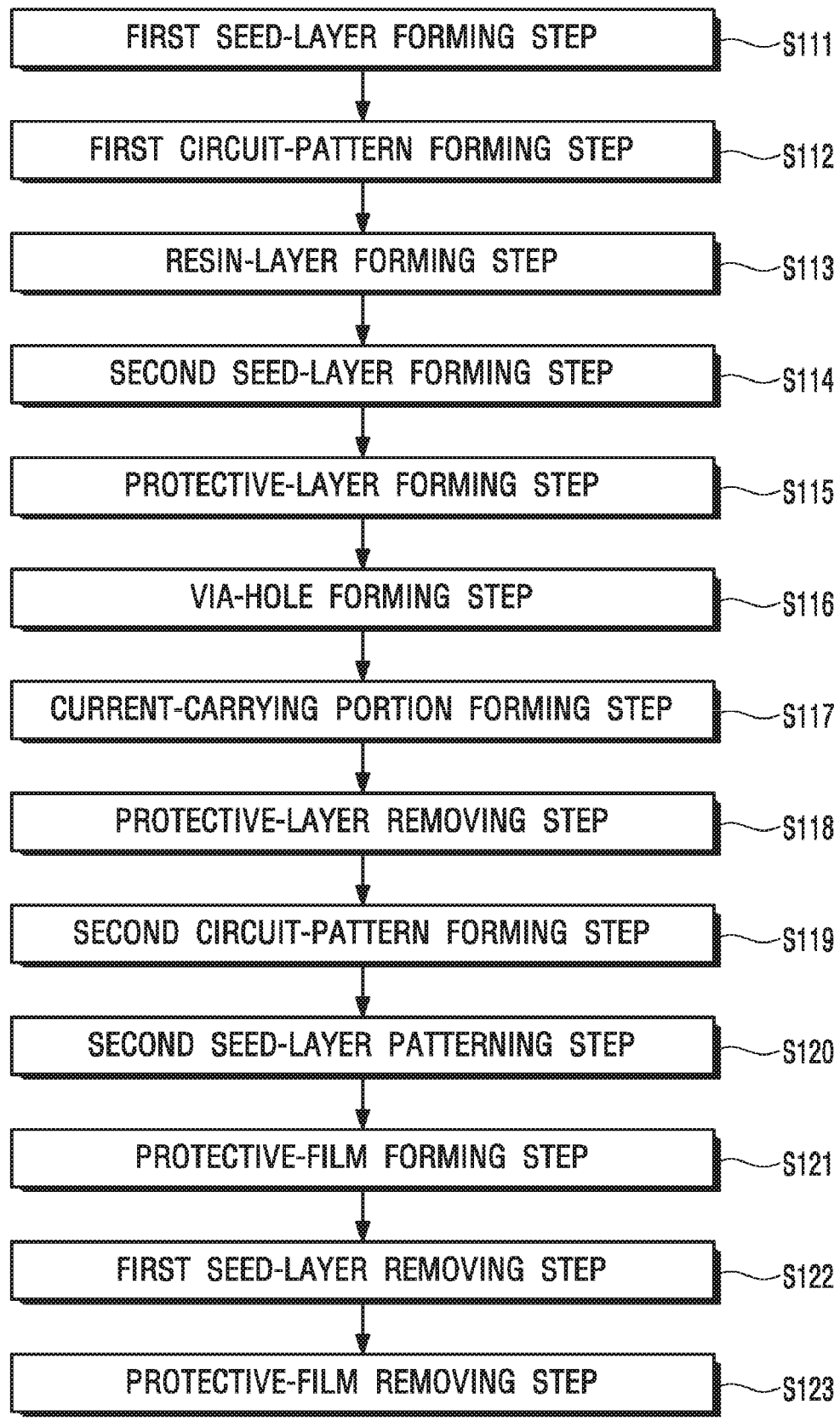
FIG. 16 is a flowchart showing a method of forming a circuit using a seed layer according to a ninth embodiment of the present invention.
Figure 17:
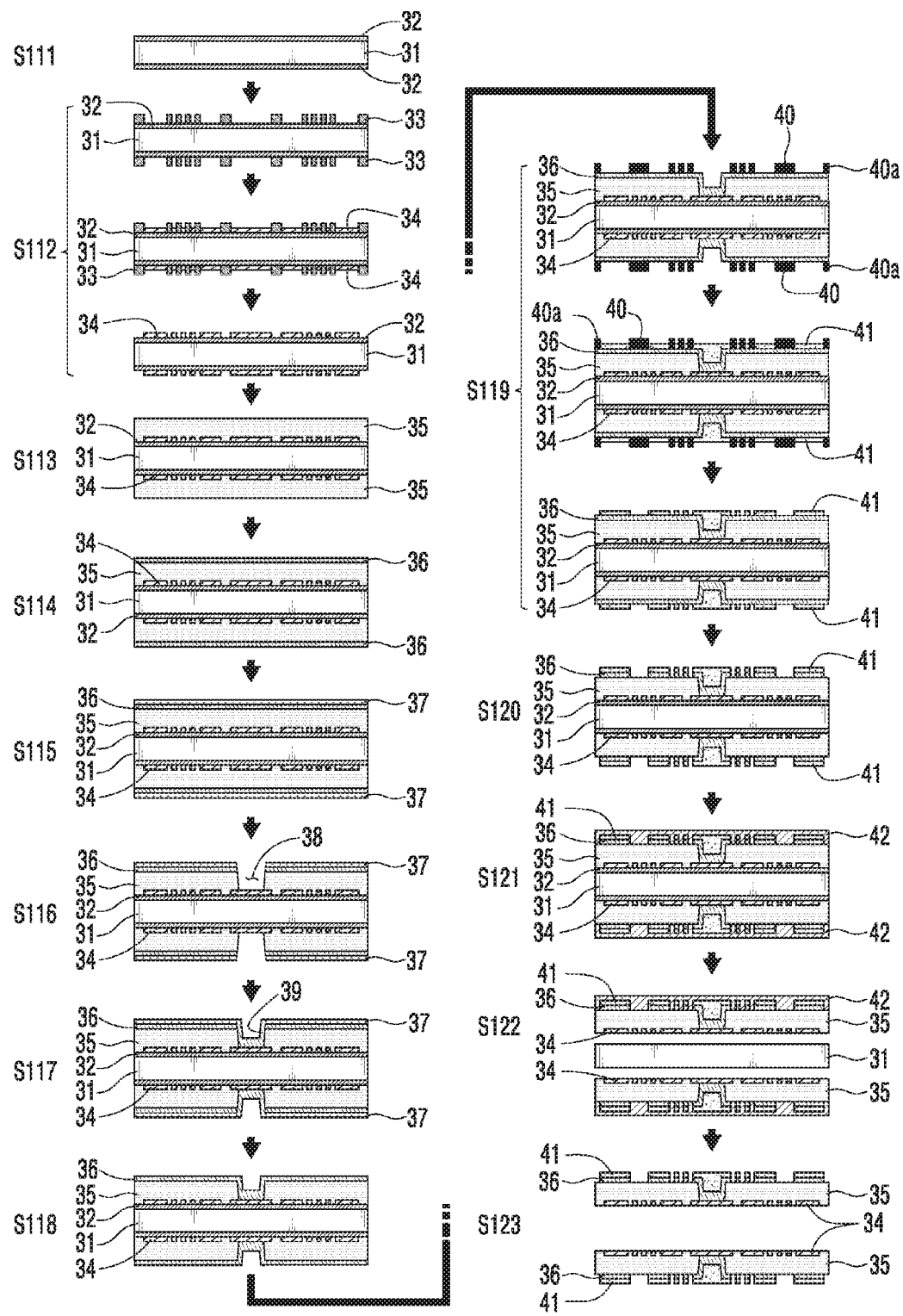
FIG. 17 is a cross-sectional view showing process steps in FIG. 16 according to the present invention.

FIG. 16 is a flowchart showing a method of forming a circuit using a seed layer according to the ninth embodiment of the present invention, and FIG. 17 is a cross-sectional view showing process steps in FIG. 16 according to the present invention.

As shown therein, the method of forming the circuit using the seed layer according to the ninth embodiment of the present invention includes a first seed-layer forming step S111, a first circuit-pattern forming step S112, a resin-layer forming step S113, a second seed-layer forming step S114, a protective-layer forming step S115, a via-hole forming step S116, a current-carrying portion forming step S117, a protective-layer removing step S118, a second circuit-pattern forming step S119, a second seed-layer patterning step S120, a protective-film forming step S121, a first seed-layer removing step S122, and a protective-film removing step S123.

In the first seed-layer forming step S111, a first conductive material of silver (Ag) is coated on each side of a carrier member 31 of an insulating material, thereby preparing a first seed layer 32.

The first circuit-pattern forming step S112 includes a pattern-layer forming step of forming a circuit pattern by a semi additive process (SAP) method, a plating step, and a pattern-layer removing step. In the pattern-layer forming step, a photosensitive material is used to form a pattern layer 33 on the prepared conductive first seed layer 32, and the pattern layer 33 is subjected to a lithography process to thereby form a pattern groove through which the first seed layer 32 is selectively exposed. Therefore, the first seed layer 32 is selectively exposed through the pattern groove of the pattern layer 33 in accordance with patterns desired to form a circuit. In the plating step, the inside of the pattern groove is plated with the second conductive material, thereby forming a first circuit pattern 34. In this case, the second conductive material may be made of copper of which electrical conductivity is very high. The second conductive material may be filled in the pattern groove because the first seed layer 32 exposed through the pattern groove serves as an electrode during the plating process. In the pattern-layer removing step, the pattern layer 33 is removed except the second conductive material filled in the pattern groove.

In the resin-layer forming step S113, a resin layer 35 is formed on the first seed layer 32. By applying heat and pressure to the resin layer 35 formed on the first seed layer, the resin layer 35 is cured as surrounding the first circuit pattern 34 formed on the first seed layer 32.

In the second seed-layer forming step S114, a second seed layer 36 is formed by applying the first conductive material of silver (Ag) to the resin layer 35 of the insulating material. The second seed layer 36 may be formed by gravure coating, screen printing, slot die coating, spin coating, etc.

In the protective-layer forming step S115, a protective layer 37 of PI, polyethylene terephthalate (PET), nylon, etc. is formed on the second seed layer 36. The protective layer 37 may be adhered onto the second seed layer 36 in the form of being easily separable from the second seed layer 36 after forming a via hole 38.

In the via-hole forming step S116, the via hole 38 is formed to pass via the protective layer 37, the second seed layer 36, and the resin layer 35 and expose a portion of the first circuit pattern 34. The via hole 38 may be formed by laser drilling, etc. In this case, the protective layer 37 is formed on the second seed layer 36, and therefore prevents the surface of the second seed layer 36 from being contaminated with carbide that is produced in a laser drilling process.

In the current-carrying portion forming step S117, the via hole 38 is filled with the first conductive material to thereby form a current carrying portion 39 for electric connection between the first circuit pattern 34 and the second seed layer 36. Meanwhile, to fill the conductive material in the via hole 38, a silver printing or electroless plating technique may be used.

In the protective-layer removing step S118, the protective layer 37 coupled to the top side of the second seed layer 36 is removed, so that the second seed layer 36 can be exposed, thereby allowing a second circuit pattern 41 to be formed on the second seed layer 36. Meanwhile, adhesion between the protective layer 37 and the second seed layer 36 is set to be relatively weaker than adhesion between the second seed layer 36 and the resin layer 35. Therefore, in the protective-layer removing step S118, it is possible to not only easily separate the protective layer 37 from the second seed layer 36 but also prevent the second seed layer 36 from being separated from the resin layer 35 while removing the protective layer 37.

The second circuit-pattern forming step S119 includes the pattern-layer forming step of forming a circuit pattern by the SAP method, the plating step, and the pattern-layer removing step like the first circuit-pattern forming step S112. In this pattern-layer forming step, a photosensitive material is used to form a pattern layer 40 on the prepared conductive second seed layer 36, and the pattern layer 40 is subjected to a lithography process to thereby form a pattern groove through which the second seed layer 36 is selectively exposed. Therefore, the second seed layer 36 is selectively exposed though the pattern groove of the pattern layer 40 in accordance with patterns desired to form a circuit. Here, the lithography process for forming the pattern groove is performed on the second seed layer 36 of silver (Ag), so that the second seed layer 36 can be more improved in surface roughness than a conventional seed layer formed by plating and made of copper (Cu). In other words, diffused reflection that occurs on the surface of the second seed layer positioned at a lower layer during an exposure process is suppressed as compared with the conventional diffused reflection, and therefore the pattern groove is relatively precisely formed, thereby having an effect on making it possible to form a fine circuit.

Meanwhile, in the plating step, the inside of the pattern groove is plated with the second conductive material, thereby forming the second circuit pattern 41. In this case, the second conductive material may be copper having very high electrical conductivity. The second conductive material may be filled in the pattern groove because the second seed layer 36 exposed through the pattern groove serves as an electrode during the plating process.

Further, in the pattern-layer removing step, the pattern layer 40 is removed except the conductive material filled in the pattern groove.

Particularly, in the pattern-layer forming step, an edge pattern 40*a* is formed to surround a top edge of the second seed layer 36. Therefore, after the pattern-layer removing step, the second seed layer 36 can be exposed along an outer edge of the second circuit pattern 41.

In the second seed-layer patterning step S120, the second seed layer 36 exposed to the outside without overlapping with the second circuit pattern 41 is removed. The second seed layer 36 patterned by the step of patterning the second seed layer 36, together with the second circuit pattern 41, forms the circuit pattern. As a method of patterning the second seed layer 36, a flash etching technique may be used. Meanwhile, the outer edge of the second seed layer 36 is also removed corresponding to the edge pattern 40*a*.

As described above, in the ninth embodiment, layers built up on both sides of the carrier member 31 form double-sided circuit boards, thereby manufacturing a pair of double-sided circuit boards through a single series of successive processes.

In the protective-film forming step S121, a protective film 42 is formed by applying the photosensitive material onto the second circuit pattern 41. In this case, the protective film 42 covers the top of the resin layer 35 exposed as the second seed layer 36 is patterned in the second seed-layer patterning step 120, thereby fully covering the exposure surface of the second seed layer 36.

In the first seed-layer removing step S122, the first seed layer 32 is removed, so that the double-sided circuit boards formed on the both sides of the carrier member 31 are easily separable from the carrier member 31. Here, to remove the first seed layer 32, a chemical method is employed using an etching solution capable of dissolving only the first seed layer 32 made of the first conductive material of silver (Ag). In this case, the second seed layer 36 made of silver (Ag), the same material as the first seed layer 32, is not exposed to the outside as fully surrounded with the protective film 42, and thus the second seed layer 36 is prevented from being dissolved by this etching solution even while the first seed layer 32 is etched.

That is, when the first seed layer 32 formed on each side of the carrier member 31 is dissolved, the double-sided circuit board formed on each side of the carrier member 31 is separable from the carrier member 31. Therefore, unlike a conventional method, there are no needs of exerting physical force to the double-sided circuit board in order to separate the double-sided circuit board from the carrier member 31. Further, copper (Cu) is not dissolved while the first seed layer 32 is dissolved, and therefore the first circuit pattern 34 is prevented from damage.

In the protective-film removing step S123, the protective film 42 formed on the second circuit pattern 41 is removed after the first seed-layer removing step S122. When the protective film 42 is made of a photosensitive material, the protective film 42 is removable through the same process as that of the pattern-layer removing step.

Meanwhile, a package process of mounting electronic parts on at least one of the first circuit pattern 34 and the second circuit pattern 41 of the double-sided circuit board may be carried out after the protective-film removing step S123. In this case, the first circuit pattern 34 and the second circuit pattern 41 are not exposed to the etching solution capable of dissolving copper, and therefore maintain a smooth circuit surface, thereby improving a yield of the package process.

Next, a method of forming a circuit using a seed layer according to a tenth embodiment of the present invention will be described.

Figure 18:
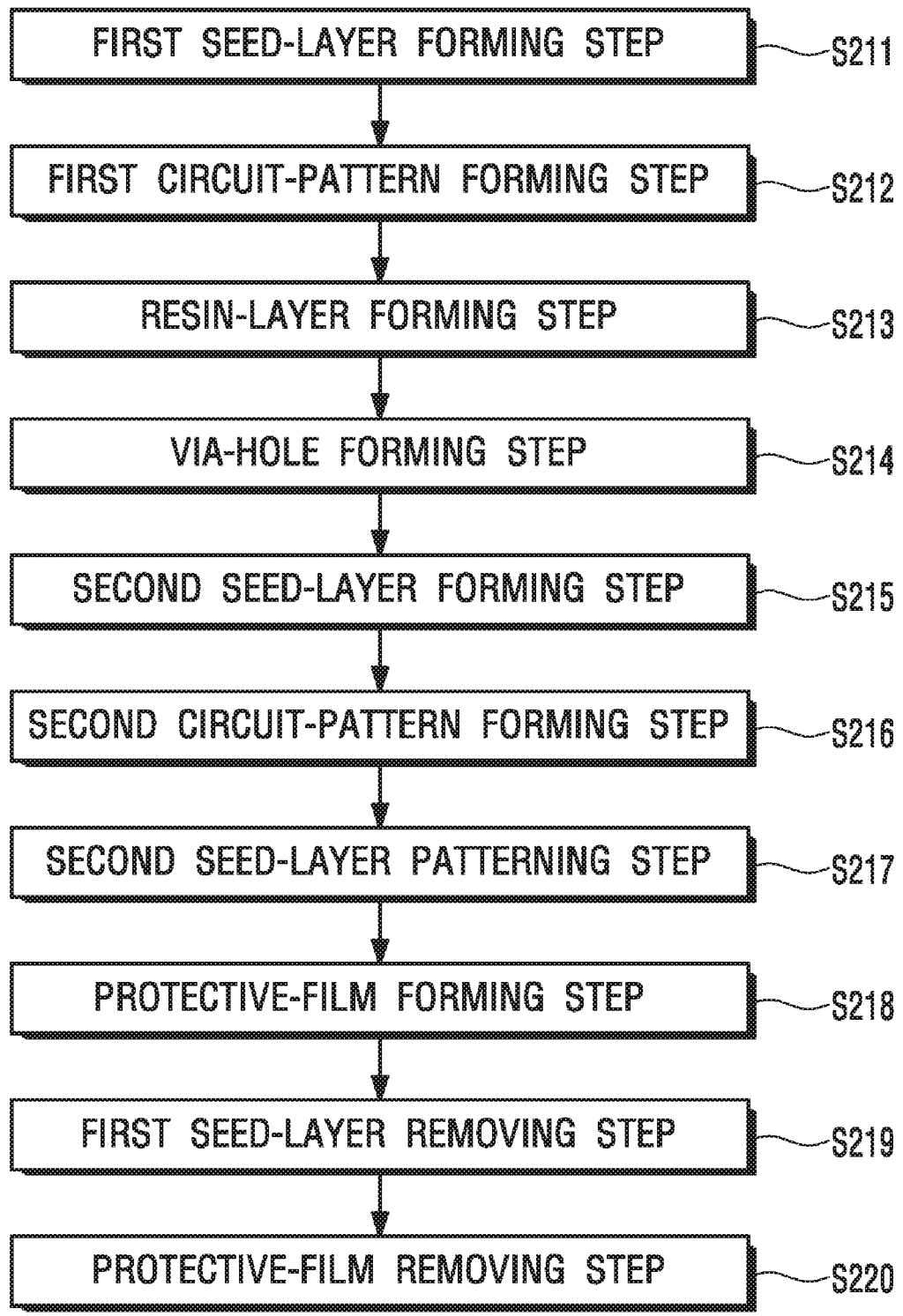
FIG. 18 is a flowchart showing a method of forming a circuit using a seed layer according to a tenth embodiment of the present invention.
Figure 19:
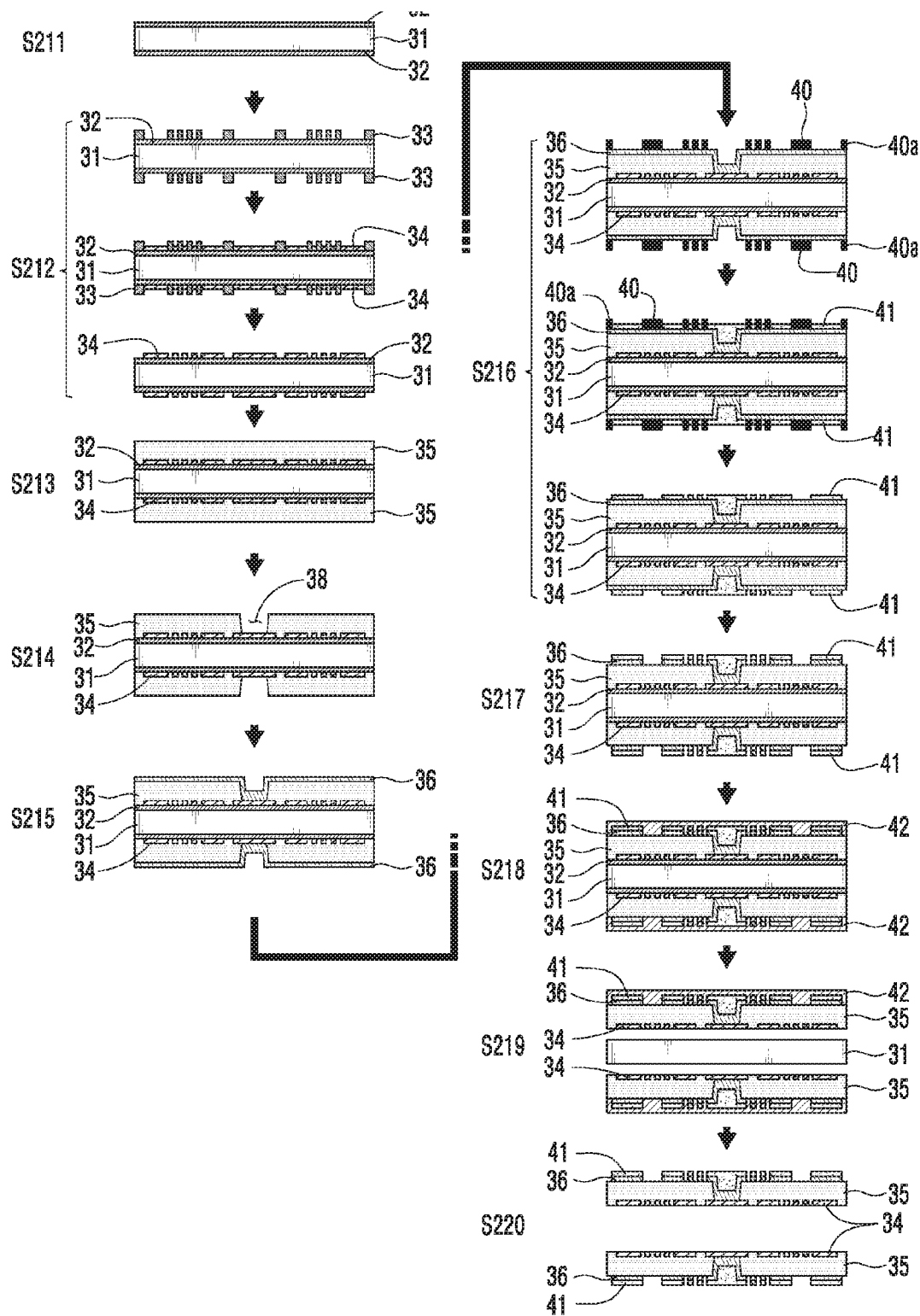
FIG. 19 is a cross-sectional view showing process steps in FIG. 18 according to the present invention.

FIG. 18 is a flowchart showing a method of forming a circuit using a seed layer according to a tenth embodiment of the present invention, and FIG. 19 is a cross-sectional view showing process steps in FIG. 18 according to the present invention.

As shown therein, the method of forming the circuit using the seed layer according to a tenth embodiment of the present invention includes a first seed-layer forming step S211, a first circuit-pattern forming step S212, a resin-layer forming step S213, a via-hole forming step S214, a second seed-layer forming step S215, a second circuit-pattern forming step S216, a second seed-layer patterning step S217, a protective-film forming step S218, a first seed-layer removing step S219, and a protective-film removing step S220.

In the first seed-layer forming step S211, each side of a carrier member 31 made of an insulating material is coated with a first conductive material of silver (Ag), thereby forming a first seed layer 32.

In the first circuit-pattern forming step S212, a pattern layer 33 is formed on the first seed layer 32, a pattern groove is formed on the pattern layer 33, the first conductive material of copper is filled in the pattern groove by a plating process, and the pattern layer 33 is removed. The step of forming the first circuit pattern 34 refers to a process for forming the first circuit pattern 34 of copper on the first seed layer 32, which is the same as the first circuit-pattern forming step of the ninth embodiment, and thus detailed descriptions thereof will be omitted.

In the resin-layer forming step S213, a resin layer 35 is formed to fully cover the first circuit pattern 34 formed on the first seed layer 32.

In the via-hole forming step S214, a via hole 38 is formed to penetrate the resin layer 35 and exposure a portion of the first circuit pattern 34.

In the second seed-layer forming step S215, the resin layer 35 formed with the via hole 38 is coated with the first conductive material of silver (Ag), thereby forming the second seed layer 36. In this case, the second seed layer 36 is formed along the top of the resin layer 35 and the inner wall of the via hole 38, and therefore the second seed layer 36 is electrically connected to the first circuit pattern 34 exposed through the via hole 38.

Meanwhile, a series of processes from the second circuit-pattern forming step S216 to the protective-film removing step S220 after the second seed-layer forming step S215 are the same as those of the ninth embodiment, and thus detailed descriptions thereof will be omitted.

Next, a method of forming a circuit using a seed layer according to an eleventh embodiment of the present invention will be described.

Figure 20:
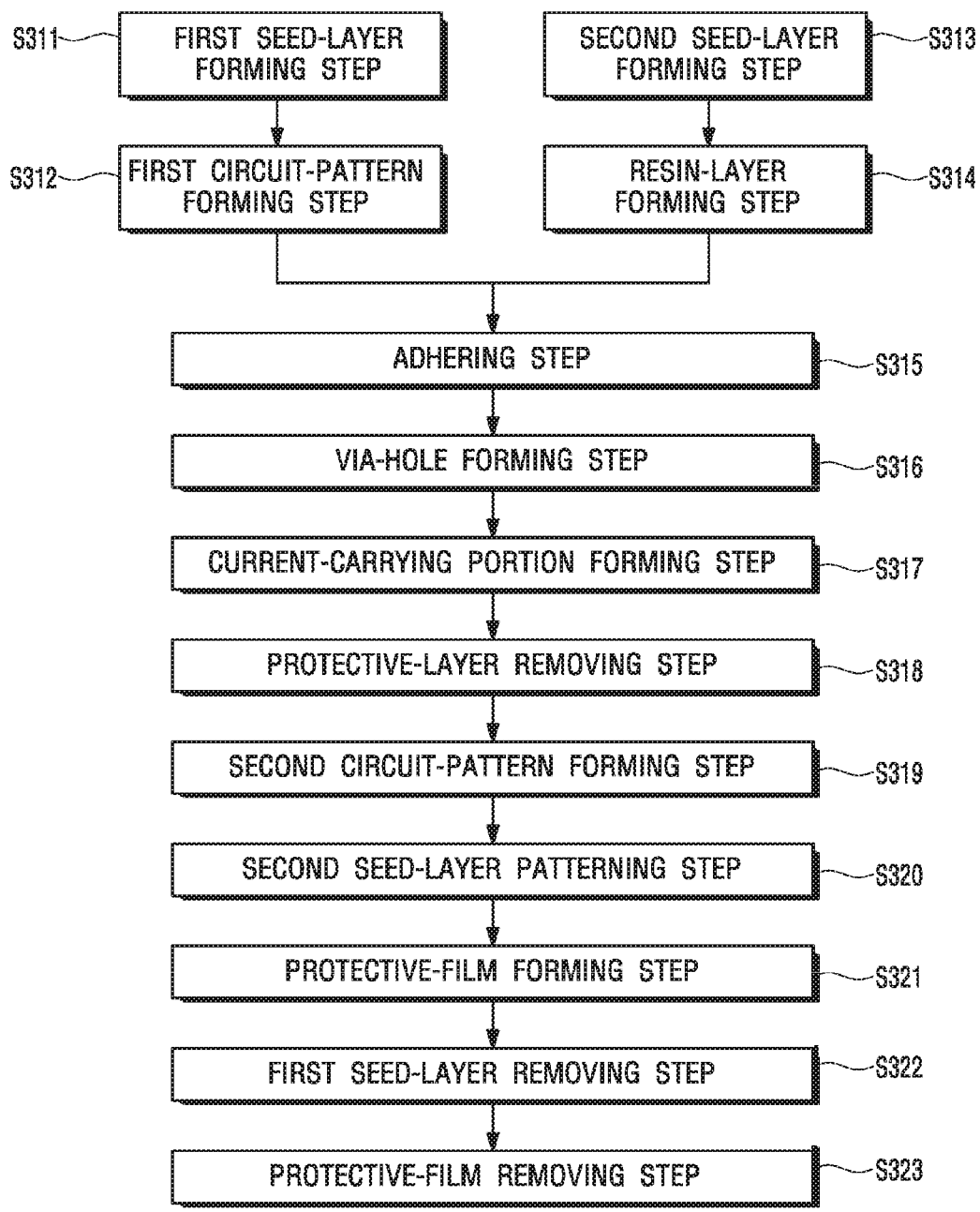
FIG. 20 is a flowchart showing a method of forming a circuit using a seed layer according to an eleventh embodiment of the present invention.
Figure 21:
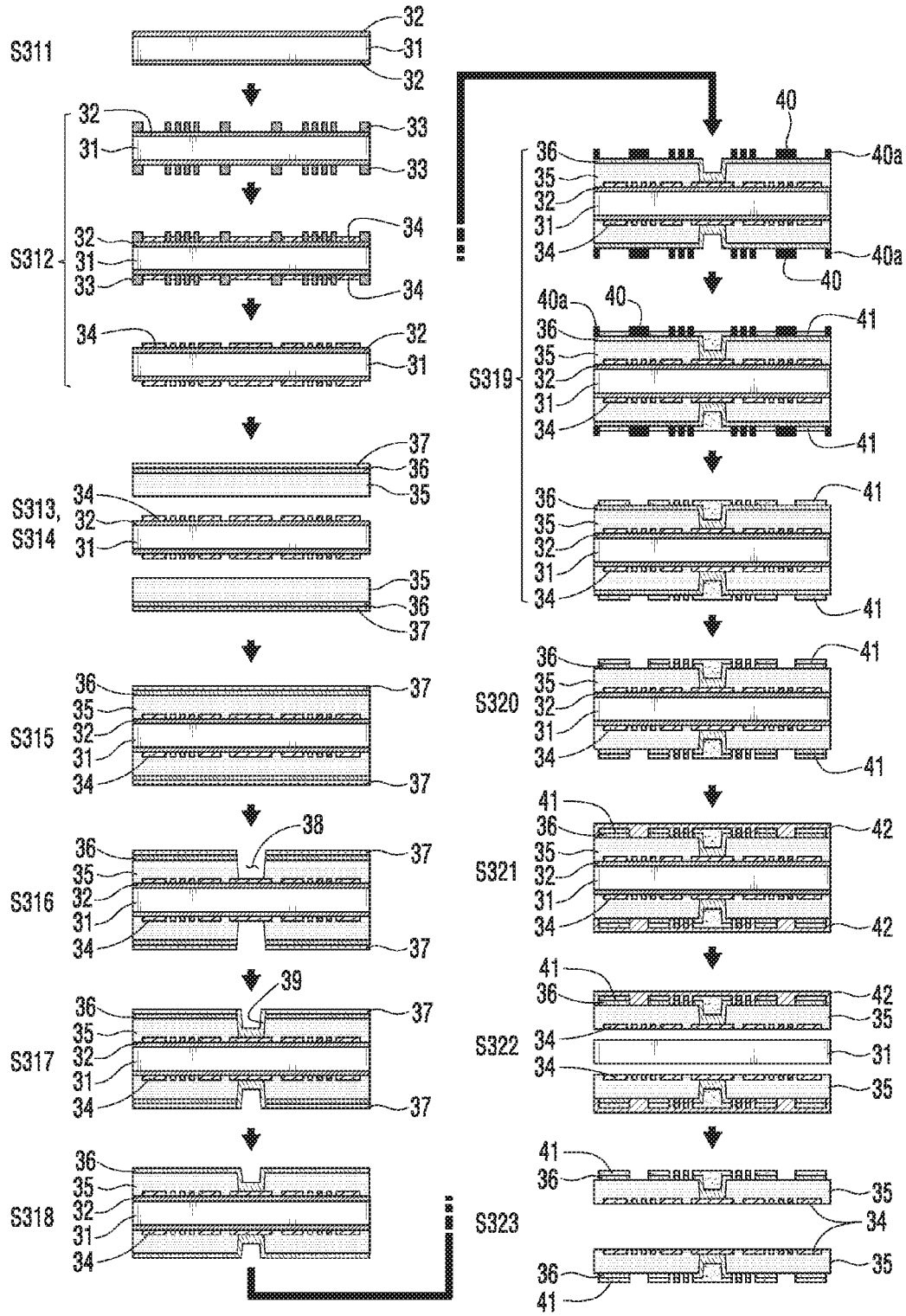
FIG. 21 is a cross-sectional view showing process steps in FIG. 20 according to the present invention.

FIG. 20 is a flowchart showing a method of forming a circuit using a seed layer according to the eleventh embodiment of the present invention, and FIG. 21 is a cross-sectional view showing process steps in FIG. 20 according to the present invention.

As shown therein, the method of forming the circuit using the seed layer according to the eleventh embodiment of the present invention includes a first seed-layer forming step S311, a first circuit-pattern forming step S312, a second seed-layer forming step S313, a resin-layer forming step S314, an adhering step S315, a via-hole forming step S316, a current-carrying portion forming step S317, a protective-layer removing step S318, a second circuit-pattern forming step S319, a second seed-layer patterning step S320, a protective-film forming step S321, a first seed-layer removing step S322, and a protective-film removing step S323.

In the first seed-layer forming step S311, each side of a carrier member 31 made of an insulating material is coated with a first conductive material of silver (Ag), thereby forming a first seed layer 32.

In the first circuit-pattern forming step S312, a pattern layer 33 is formed on the first seed layer 32, a pattern groove is formed on the pattern layer 33, the first conductive material of copper is filled in the pattern groove by a plating process, and the pattern layer 33 is removed. The first circuit-pattern forming step S312 refers to a process for forming the first circuit pattern 34 of copper on the first seed layer 32, which is the same as the first circuit-pattern forming step of the ninth embodiment, and thus detailed descriptions thereof will be omitted.

In the second seed-layer forming step S313, a separately provided protective layer 37 is internally coated with the first conductive material of silver (Ag), thereby forming a second seed layer 36.

In the resin-layer forming step S314, uncured thermosetting preimpregnated materials (PREPREG) resin is applied to the inside of the second seed layer 36, so that the second seed layer 36 and the resin layer 35 can be sequentially stacked on the inner surface of the protective layer 37.

In the adhering step S315, the protective layer 37 is positioned on each side of the carrier member 31, and the first circuit pattern 34 and the resin layer 35 are adhered as pressed in the state that the first circuit pattern 34 and the resin layer 35 are disposed to face with each other. In this adhering step S315, a hot-press process of providing both pressure and heat may be used. By the hot-press process, not only the adhesion is achieved, but also the resin layer 35 is cured.

Meanwhile, a series of processes from the via-hole forming step S316 to the protective-film removing step S323 after the adhering step 315 are the same as those of the ninth embodiment, and thus detailed descriptions thereof will be omitted.

Next, a method of forming a circuit using a seed layer according to a twelfth embodiment of the present invention will be described.

Figure 22:
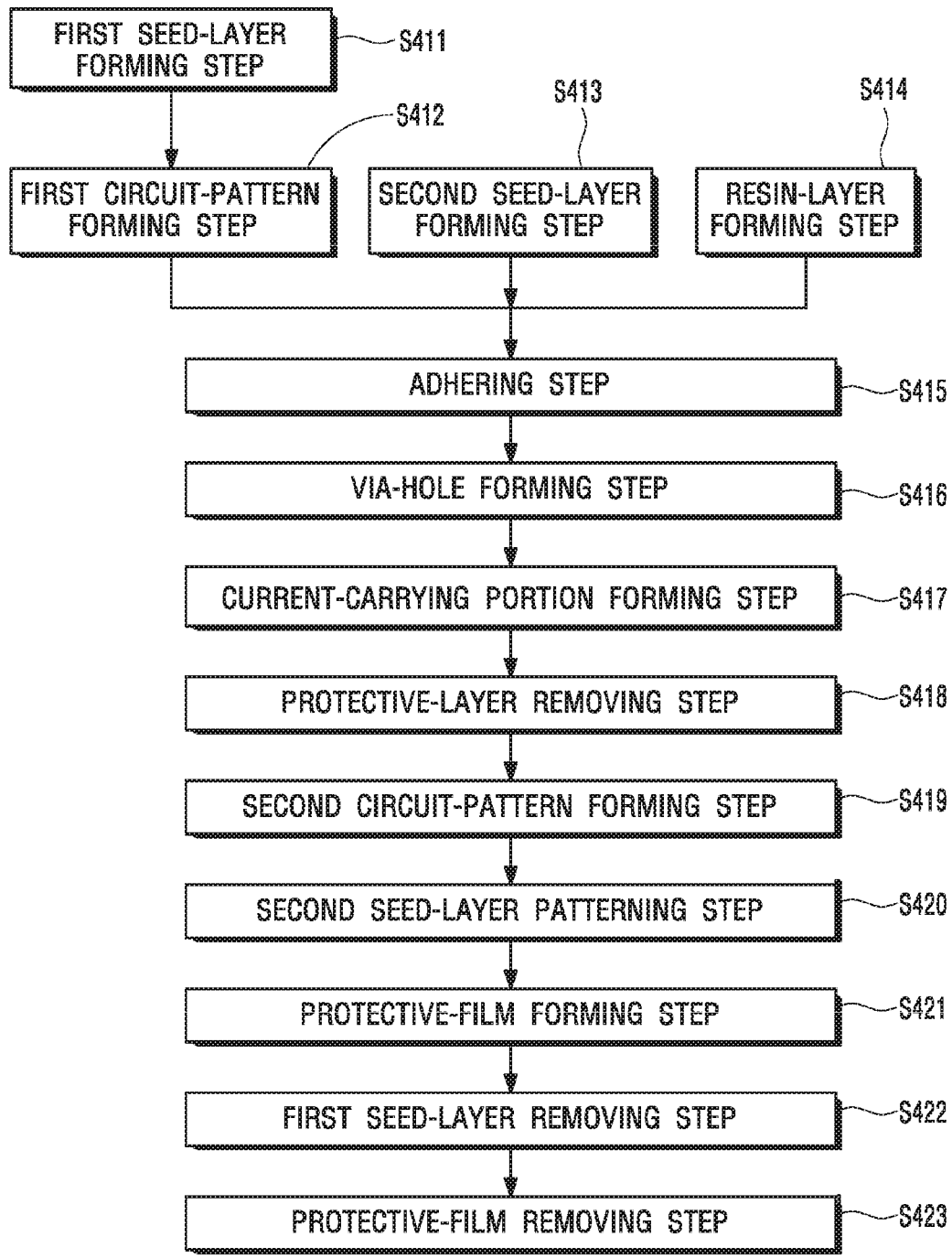
FIG. 22 is a flowchart showing a method of forming a circuit using a seed layer according to a twelfth embodiment of the present invention.
Figure 23:
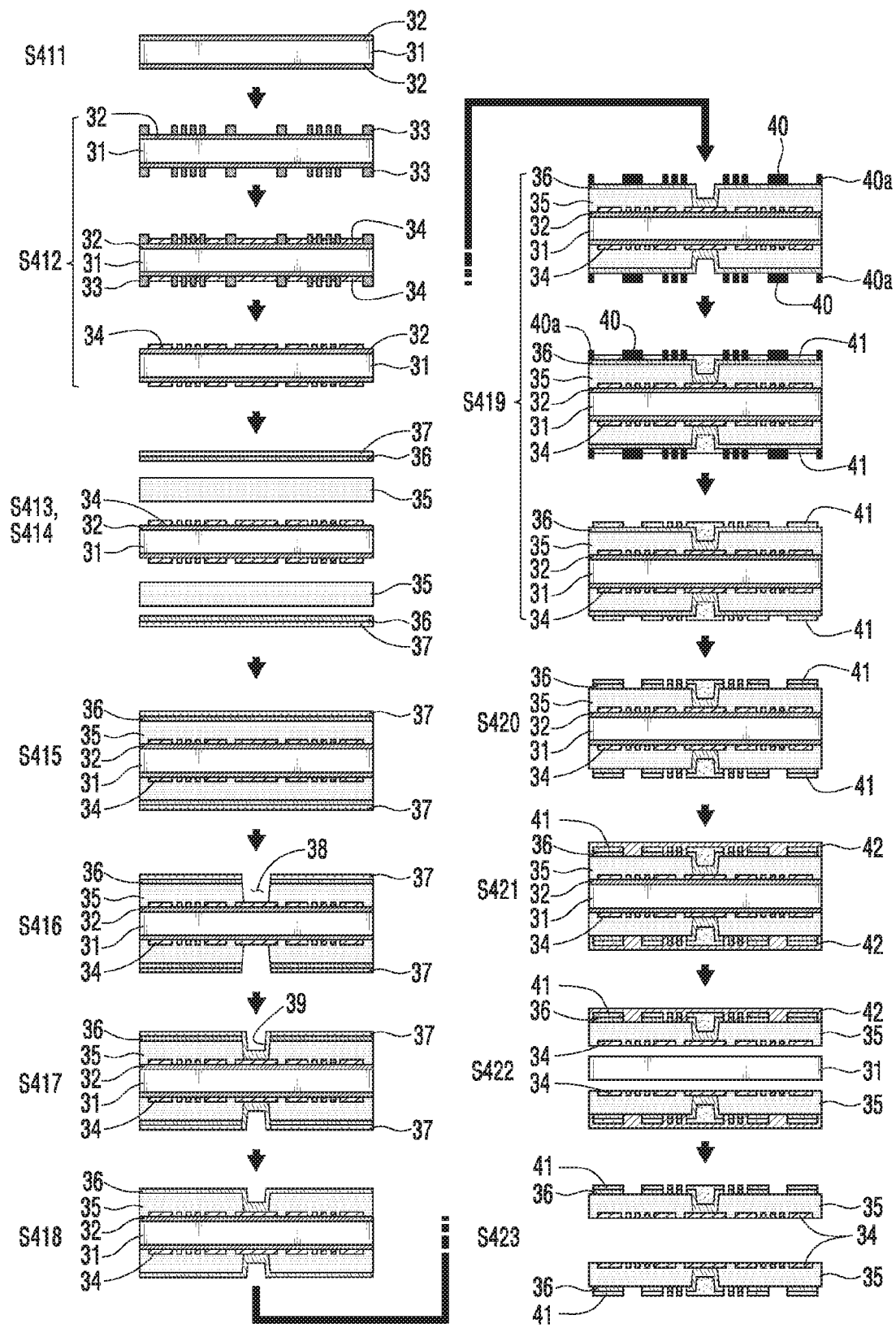
FIG. 23 is a cross-sectional view showing process steps in FIG. 22 according to the present invention.

FIG. 22 is a flowchart showing a method of forming a circuit using a seed layer according to the twelfth embodiment of the present invention, and FIG. 23 is a cross-sectional view showing process steps in FIG. 22 according to the present invention.

As shown therein, the method of forming the circuit using the seed layer according to the twelfth embodiment of the present invention includes a first seed-layer forming step S411, a first circuit-pattern forming step S412, a second seed-layer forming step S413, a resin-layer forming step S414, a adhering step S415, a via-hole forming step S416, a current-carrying portion forming step S417, a protective-layer removing step S418, a second circuit-pattern forming step S419, a second seed-layer patterning step S420, a protective-film forming step S421, a first seed-layer removing step S422, and a protective-film removing step S423.

In the first seed-layer forming step S411, each side of a carrier member 31 made of an insulating material is coated with a first conductive material of silver (Ag), thereby forming a first seed layer 32.

In the first circuit-pattern forming step S412, a pattern layer 33 is formed on the first seed layer 32, a pattern groove is formed on the pattern layer 33, the first conductive material of copper is filled in the pattern groove by a plating process, and the pattern layer 33 is removed. The first circuit-pattern forming step S412 refers to a process for forming the first circuit pattern 34 of copper on the first seed layer 32, which is the same as the first circuit-pattern forming step of the ninth embodiment, and thus detailed descriptions thereof will be omitted.

In the second seed-layer forming step S413, a separately provided protective layer 37 is internally coated with the first conductive material of silver (Ag), thereby forming a second seed layer 36.

In the resin-layer forming step S414, a resin layer 35 of a semi-cured thermosetting PREPREG sheet is prepared.

In the adhering step S415, both the resin layer 35 and the protective layer 37 are positioned on each side of the carrier member 31, and the first circuit pattern 34, the resin layer 35 and the second seed layer 36 are adhered as pressed in the state that the first circuit pattern 34, the resin layer 35 and the second seed layer 36 are sequentially disposed to face with each other. In this adhering step S315, a hot-press process of providing both pressure and heat may be used. By the hot-press process, not only the adhesion is achieved, but also the resin layer 35 is cured. In this adhering step S415, a hot-press process of providing both pressure and heat may be used. By the hot-press process, not only the adhesion is achieved, but also the resin layer 35 is cured.

Meanwhile, a series of processes from the via-hole forming step S416 to the protective-film removing step S423 after the adhering step 415 are the same as those of the ninth embodiment, and thus detailed descriptions thereof will be omitted.

Below, an etching solution composition for selectively etching the seed layer of the present invention will be described.

As the etching solution composition according to the present invention, there may be used an etching solution composition that contains an ammonium compound and an oxidizing agent, disclosed in Korean Patent No. 10-0712879 owned by the present applicant; or a selective etching solution composition that contains oxidative gas, peroxides, peracid, or the like oxidizing agent, aliphatic amine or aromatic amine or alkanol amine or an ammonium compound, a chelate agent, defoamer, humectant, pH regulator and one or more other additives selected for improving etching performance of the etching solution, and water. Each composition of the selective etching solutions will be described below in detail.

The oxidizing agent contained in the etching solution composition serves to oxidize silver on the surface of the seed layer. The related art has disclosed the etching solution composition or the like using nitric acid, hydrochloric acid, sulfuric acid, phosphoric acid, iron nitrate, iron chloride, iron sulfate, iron phosphate, etc. However, such conventional etching solution compositions refer to materials for oxidizing and dissociating copper, nickel, chrome or the like metal, and are not suitable to be used as a circuit etching solution for selectively etching only silver.

The oxidizing agent includes air, oxygen, ozone or the like oxidative gas, sodium perborate, hydrogen peroxide, sodium bismuthate, sodium percarbonate, benzoyl peroxide, potassium peroxide, sodium peroxide or the like peroxides, formic acid, peroxyacetic acid, perbenzoic acid, 3-chloroperoxybenzoic acid, trimethylacetic acid or the like peroxy acid, and potassium persulfate. The oxidizing agent may be used mixing with at least one oxidizing agent.

With respect to the total weight of the etching solution composition of silver, silver alloy or a silver compound, 1~30 wt %, more preferably, 5~18 wt % of oxidizing agent may be included. The oxidizing agent lower than 1 wt % makes etching speed be low and etching be incompletely performed, thereby producing a lot of silver residue. The silver residue may be present between a circuit and a circuit and cause a short-circuit, thereby causing a defective product. Further, productivity is adversely affected by the low etching speed. On the other hand, the oxidizing agent more than 30 wt % makes the exposed seed layer be fast etched, but affects the seed layer present under the circuit layer, thereby causing an excessive under-cut. Such an under-cut phenomenon has an adverse effect on the adhesion of the circuit layer, and thus needs to be suppressed.

Aliphatic amine or aromatic amine or alkanol amine or ammonium compound contained in the etching solution composition of the present invention serves to dissociate silver oxidized in the seed layer. By oxidation based on the oxidizing agent and dissociation based on aliphatic or aromatic amine, it is possible to selectively etch only silver, silver alloy or a silver compound. As described above, nitric acid, hydrochloric acid, sulfuric acid, phosphoric acid, iron nitrate, iron hydrochloride, iron sulfate, iron phosphate, etc. included in the conventional etching solution composition cause both oxidation and dissociation because one material serves as a main etching agent to react with copper. However, in the etching solution according to the present invention, two materials are respectively in charge of the oxidation and the dissociation, and the aliphatic or aromatic amine or alkanol amine or the ammonium compound has a more violent dissociation reaction with oxidized silver than with copper, thereby selectively etching only the seed layer made of silver, silver alloy or a silver compound.

The aliphatic or aromatic amine or alkanol amine or the ammonium compound may use ethylamine, propylamine, isopropylamine, n-butylamine, isobutylamine, sec-butylamine, diethylamine, piperidine, tyramine, N-methyltyramine, pyrroline, pyrrolidine, imidazole, indole, pyrimidine, ethanolamine, 6-amino-2-methyl-2-heptanol, 1-amino-2-propanol, methanolamine, dimethylethanolamine, N-methylethanolamine, 1-aminoethanol, 2-amino-2-methyl-1-propanol, ammonium carbonate, ammonium phosphate, ammonium nitrate, ammonium fluoride, ammonium hydroxide, or the like amines or ammonium compound. When such amines or ammonium compound is used, at least one of the amines or the ammonium compound may be mixed.

With respect to the total weight of the etching solution composition of the seed layer 32 made of silver, 1~15 wt %, more preferably, 3~10 wt % of aliphatic or aromatic amine or alkanol amine or the ammonium compound may be included. The aliphatic or aromatic amine or alkanol amine or the ammonium compound lower than 1 wt % makes a dissociation reaction with oxidized silver be inactive, thereby lowering the speed of etching the silver seed layer. On the other hand, the aliphatic or aromatic amine or alkanol amine or the ammonium compound more than 15 wt % does not have a problem in selectively etching the seed layer, but excessive use of the amines or the ammonium compound causes a price rise of the etching solution. Therefore, the amines or the ammonium compound is used enough to cause a surface oxidation reaction of the seed layer and make selective etching smooth by dissolve oxidized silver.

The chelate agent, defoamer, humectant, pH regulator and one or more other additives selected for improving etching performance of the etching solution, which are included in the etching solution composition according to the present invention, serve to remove bubbles that may be generated in the oxidation reaction, give wetting properties so that the etching solution can be well absorbed onto the surface of the seed layer, and so on. Besides, general purpose additives may be selected and used to increase the effects of the present invention.

With respect to the total weight of the etching solution composition for the seed layer 32 made of silver, each of the additives may be included by 0.1~7 wt %, more preferably, 0.3~4 wt % according to the kinds and purposes thereof. The additives less than 0.1 wt % cannot carry out their own roles.

A remainder from a total 100 wt % of etching solution composition according to the present invention except the foregoing material is water. Deionized water may be used for this water.

The present invention is not limited to the foregoing embodiments, and may be actualized by various embodiments within the appended claims. It will be appreciated by any person having an ordinary skill in the art that changes can be made in these embodiments without departing from the scope of the present invention defined in the appended claims.

REFERENCE NUMERALS

| | |
|---|---|
| 1: release film | 2: seed layer |
| 3: pattern layer | 4: pattern groove |
| 5: circuit pattern | 6: resin layer |
| 7: protective layer | 8: insulation layer |
| 11: first resin layer | 12: second resin layer |
| 13: foam-sheet layer | 20: through hole |
| 31: carrier member | 32: first seed layer |
| 33: pattern layer | 34: first circuit pattern |
| 35: resin layer | 36: second seed layer |
| 37: protective layer | 38: via hole |
| 39: current carrying portion | 40: pattern layer |
| 40a: edge pattern | 41: second circuit pattern |
| 42: protective film | |

What is claimed is:

1. A method of forming a circuit using a seed layer, comprising:
    preparing a seed layer of a first conductive material;
    forming a pattern layer with a pattern groove, through which the seed layer is selectively exposed, on the seed layer;
    plating the pattern groove by filling a second conductive material into the pattern groove using a plating process;
    forming a resin layer on the pattern layer and on the second conductive material; and
    removing the seed layer on the pattern layer and on the second conductive material,
    the first conductive material and the second conductive material are different in material from each other;
    wherein the removing the seed layer comprises using an etching solution capable of selectively removing the seed layer to remove the seed layer,
    wherein the first conductive material comprises silver (Ag), and the second conductive material comprises copper (Cu),
    wherein the etching solution composition comprises:
    1~30 wt % of an oxidizing agent comprising oxidative gas, peroxides, or peracid,
    1~15 wt % of aliphatic amine or aromatic amine or alkanol amine compound,
    0.1~7 wt % of a chealate agent, defoamer, humectant, pH regulator and one or more other additives for improving etching performance of an etching solution, and
    water added as a remainder of a total 100 wt % of the etching solution composition;
    wherein the oxidizing agent comprises at least one of oxidative gas such as air, oxygen, ozone, and the like; peroxides such as sodium perborate, hydrogen peroxide, sodium bismuthate, sodium percarbonate, benzoyl peroxide, potassium peroxide, sodium peroxide and the like; peroxy acid such as formic acid, peroxyacetic acid, perbenzoic acid, 3-chloroperoxybenzoic acid, trimethylacetic acid and the like; and potassium persulfate;

wherein the compound comprises at least one of ethylamine, propylamine, isopropylamine, n-butylamine, isobutylamine, sec-butylamine, diethylamine, piperidine, tyramine, N-methyltyramine, pyrroline, pyrrolidine, imidazole, indole, pyrimidine, ethanolamine, 6-amino-2-methyl-2-heptanol, 1-amino-2-propanol, methanolamine, dimethylethanolamine, N-methylethanolamine, 1-aminoethanol, 2-amino-2-methyl-1-propanol.

2. The method according to claim 1, wherein
the seed layer is provided on a release film,
the forming the pattern layer comprises forming a pattern groove by applying a lithography process to the pattern layer provided as a photosensitive film,
the method further comprises removing the pattern layer between the plating and the forming the resin layer, and
the removing the seed layer comprises separating the release film as the seed layer is removed.

3. The method according to claim 1, wherein
the seed layer is provided on a release film,
the forming the pattern layer comprises forming a pattern groove in the pattern layer provided as a photosensitive film, and
the removing the seed layer comprises separating the release film as the seed layer is removed.

4. The method according to claim 3, further comprising forming a through hole penetrating the seed layer in an area except the area filled with the conductive material before the removing the seed layer.

5. The method according to claim 2, further comprising forming a through hole penetrating the seed layer in an area except the area filled with the conductive material before the removing the seed layer.

6. A method of forming a circuit using a seed layer, comprising:
forming a first seed layer of a first conductive material on each side of a carrier member;
forming a first circuit pattern by forming a pattern layer with a pattern groove, through which the first seed layer is selectively exposed, on the first seed layer and by plating the pattern groove with a second conductive material;
forming a resin layer on the first circuit pattern; and
removing the first seed layer to separate the carrier member by etching the first seed layer,
the first conductive material and the second conductive material being different in material from each other;
wherein the removing the first seed layer comprises dissolving and removing the first seed layer by an etching solution capable of dissolving only the first conductive material;
wherein the first conductive material comprises silver (Ag), and the second conductive material comprises copper (Cu),
wherein the etching solution composition comprises:
1~30 wt % of an oxidizing agent comprising oxidative gas, peroxides, or peracid,
1~15 wt % of aliphatic amine or aromatic amine or alkanol amine compound,
0.1~7 wt % of a chealate agent, defoamer, humectant, pH regulator and one or more other additives for improving etching performance of an etching solution, and
water added as a remainder of a total 100 wt % of the etching solution composition;
wherein the oxidizing agent comprises at least one of oxidative gas such as air, oxygen, ozone, and the like; peroxides such as sodium perborate, hydrogen peroxide, sodium bismuthate, sodium percarbonate, benzoyl peroxide, potassium peroxide, sodium peroxide and the like; peroxy acid such as formic acid, peroxyacetic acid, perbenzoic acid, 3-chloroperoxybenzoic acid, trimethylacetic acid and the like; and potassium persulfate;
wherein the compound comprises at least one of ethylamine, propylamine, isopropylamine, n-butylamine, isobutylamine, sec-butylamine, diethylamine, piperidine, tyramine, N-methyltyramine, pyrroline, pyrrolidine, imidazole, indole, pyrimidine, ethanolamine, 6-amino-2-methyl-2-heptanol, 1-amino-2-propanol, methanolamine, dimethylethanolamine, N-methylethanolamine, 1-aminoethanol, 2-amino-2-methyl-1-propanol.

7. The method according to claim 6, wherein the forming the first circuit pattern comprises forming a pattern groove by applying a lithography process to the pattern layer provided as a photosensitive film, plating the pattern groove with the second conductive material, and removing the pattern layer.

8. The method according to claim 6, further comprising:
between the forming the resin layer and the removing the first seed layer,
forming a second seed layer of the first conductive material on the resin layer; and
forming a second circuit pattern by forming a pattern layer with a pattern groove, through which the second seed layer is selectively exposed, on the second seed layer and by plating the pattern groove with the second conductive material.

9. The method according to claim 8, wherein, in the forming the second circuit pattern, the pattern layer comprises an edge pattern to surround a top edge of the second seed layer.

10. The method according to claim 9, further comprising patterning the second seed layer by removing the second seed layer exposed through the second circuit pattern.

11. The method according to claim 10, wherein the forming the second circuit pattern comprises removing the pattern layer after plating the pattern groove with the second conductive material.

12. The method according to claim 11, further comprising forming a protective film on the second circuit pattern to surround an exposure surface of the second seed layer.

13. The method according to claim 12, further comprising removing a protective film after the removing the first seed layer.

14. The method according to claim 8, further comprising, between the forming the resin layer and the forming the second seed layer, forming a via hole penetrating through the second seed layer and the resin layer to expose a portion of the first circuit pattern,
the second seed layer being formed as a film along a top of the resin layer and an inner wall of the via hole to be electrically connected to the first circuit pattern.

15. The method according to claim 8, further comprising:
between the forming the second seed layer and the forming the second circuit pattern, forming a via hole penetrating through the second seed layer and the resin layer to expose a portion of the first circuit pattern; and forming a current-carrying portion electrically connecting the first circuit pattern and the second seed layer by filling a conductive material in the via hole.

16. The method according to claim 15, further comprising, between the forming the second seed layer and the forming the via hole, forming a protective layer on the second seed layer.

17. The method according to claim 16, further comprising, between the forming the current carrying portion and the forming the second circuit pattern, removing the protective layer.

18. A method of forming a circuit using a seed layer, comprising:

forming a first seed layer with a first conductive material of silver (Ag) on each side of a carrier member;

forming a first circuit pattern with a second conductive material of copper (Cu) on the first seed layer;

forming a second seed layer with the first conductive material of silver (Ag) on an inner side of a separately provided protective layer;

forming a resin layer between the second seed layer and the first circuit pattern;

adhering the second seed layer, the resin layer, and the first circuit pattern which are disposed in sequence;

forming a via hole penetrating through the protective layer, the second seed layer, and the resin layer to expose a portion of the first circuit pattern;

forming a current carrying portion electrically connecting the first circuit pattern and the second seed layer by filling a conductive material in the via hole;

removing the protective layer;

forming a second circuit pattern with the second conductive material on the second seed layer; and removing the first seed layer by an etching solution capable of dissolving only the first conductive material to separate the carrier member, the first conductive material and the second conductive material being different in material from each other;

wherein the etching solution composition comprises:

1~30 wt % of an oxidizing agent comprising oxidative gas, peroxides, or peracid, 1~15 wt % of aliphatic amine or aromatic amine or alkanol amine compound, 0.1~7 wt % of a chealate agent, defoamer, humectant, pH regulator and one or more other additives for improving etching performance of an etching solution, and water added as a remainder of a total 100 wt % of the etching solution composition;

wherein the oxidizing agent comprises at least one of oxidative gas such as air, oxygen, ozone, and the like; peroxides such as sodium perborate, hydrogen peroxide, sodium bismuthate, sodium percarbonate, benzoyl peroxide, potassium peroxide, sodium peroxide and the like; peroxy acid such as formic acid, peroxyacetic acid, perbenzoic acid, 3-chloroperoxybenzoic acid, trimethylacetic acid and the like; and potassium persulfate;

wherein the compound comprises at least one of ethylamine, propylamine, isopropylamine, n-butylamine, isobutylamine, sec-butylamine, diethylamine, piperidine, tyramine, N-methyltyramine, pyrroline, pyrrolidine, imidazole, indole, pyrimidine, ethanolamine, 6-amino-2-methyl-2-heptanol, 1-amino-2-propanol, methanolamine, dimethylethanolamine, N-methylethanolamine, 1-aminoethanol, 2-amino-2-methyl-1-propanol.

19. The method according to claim 18, wherein the forming the resin layer comprises forming the resin layer with semi-cured thermosetting resin, and the adhering comprises applying both pressure and heat to cure the resin layer.

20. The method according to claim 19, wherein, the forming the resin layer comprises applying the semi-cured thermosetting resin to the inner side of the second seed layer to adhere the resin layer to the second seed layer, and the adhering comprises applying both pressure and heat to cure the resin layer.

* * * * *